US011100390B2

(12) United States Patent
McBride et al.

(10) Patent No.: US 11,100,390 B2
(45) Date of Patent: Aug. 24, 2021

(54) POWER-EFFICIENT DEEP NEURAL NETWORK MODULE CONFIGURED FOR LAYER AND OPERATION FENCING AND DEPENDENCY MANAGEMENT

(71) Applicant: Microsoft Technology Licensing, LLC, Redmond, WA (US)

(72) Inventors: Chad Balling McBride, North Bend, WA (US); Amol Ashok Ambardekar, Redmond, WA (US); Kent D. Cedola, Bellevue, WA (US); George Petre, Redmond, WA (US); Larry Marvin Wall, Seattle, WA (US); Boris Bobrov, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 806 days.

(21) Appl. No.: 15/950,550

(22) Filed: Apr. 11, 2018

(65) Prior Publication Data
US 2018/0300604 A1    Oct. 18, 2018

Related U.S. Application Data

(60) Provisional application No. 62/486,432, filed on Apr. 17, 2017.

(51) Int. Cl.
*G06N 3/063* (2006.01)
*G06N 3/04* (2006.01)
(Continued)

(52) U.S. Cl.
CPC ............ *G06N 3/063* (2013.01); *G06F 1/324* (2013.01); *G06F 1/3275* (2013.01);
(Continued)

(58) Field of Classification Search
CPC .. G06F 9/30087; G06F 9/3834; G06F 9/3836; G06F 9/3838; G06N 3/063
See application file for complete search history.

(56) References Cited

U.S. PATENT DOCUMENTS

| 4,298,954 A | 11/1981 | Bigelow et al. |
| 5,091,864 A | 2/1992 | Baji et al. |
| (Continued) |

FOREIGN PATENT DOCUMENTS

| EP | 0147857 A2 | 7/1985 |
| EP | 2945290 A2 | 11/2015 |
| (Continued) |

OTHER PUBLICATIONS

Li, Dong, et al. "Hybrid operand communication for dataflow processors." PESPMA 2009 (2009): 61. (Year: 2009).*

(Continued)

*Primary Examiner* — Benjamin P Geib
(74) *Attorney, Agent, or Firm* — Newport IP, LLC; Leonard Hope

(57) ABSTRACT

A deep neural network (DNN) processor is configured to execute layer descriptors in layer descriptor lists. The descriptors define instructions for performing a forward pass of a DNN by the DNN processor. The layer descriptors can also be utilized to manage the flow of descriptors through the DNN module. For example, layer descriptors can define dependencies upon other descriptors. Descriptors defining a dependency will not execute until the descriptors upon which they are dependent have completed. Layer descriptors can also define a "fence," or barrier, function that can be used to prevent the processing of upstream layer descriptors until the processing of all downstream layer descriptors is complete. The fence bit guarantees that there are no other layer descriptors in the DNN processing pipeline before the
(Continued)

layer descriptor that has the fence to be asserted is processed.

20 Claims, 14 Drawing Sheets

(51) Int. Cl.

| | |
|---|---|
| G06N 3/06 | (2006.01) |
| G06F 9/30 | (2018.01) |
| G06F 9/38 | (2018.01) |
| G06F 12/0862 | (2016.01) |
| G06F 9/46 | (2006.01) |
| G06F 1/324 | (2019.01) |
| G06F 3/06 | (2006.01) |
| G06F 12/08 | (2016.01) |
| G06F 12/10 | (2016.01) |
| G06F 15/80 | (2006.01) |
| G06F 17/15 | (2006.01) |
| G06N 3/08 | (2006.01) |
| G06N 3/10 | (2006.01) |
| H03M 7/30 | (2006.01) |
| H04L 12/715 | (2013.01) |
| H04L 29/08 | (2006.01) |
| G06F 13/16 | (2006.01) |
| G06F 1/3234 | (2019.01) |
| G06F 12/02 | (2006.01) |
| G06F 13/28 | (2006.01) |
| H03M 7/46 | (2006.01) |
| H04L 12/723 | (2013.01) |

(52) U.S. Cl.
CPC ............ *G06F 3/0604* (2013.01); *G06F 3/067* (2013.01); *G06F 3/0631* (2013.01); *G06F 9/30087* (2013.01); *G06F 9/3836* (2013.01); *G06F 9/3887* (2013.01); *G06F 9/46* (2013.01); *G06F 12/0207* (2013.01); *G06F 12/08* (2013.01); *G06F 12/0862* (2013.01); *G06F 12/10* (2013.01); *G06F 13/1673* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1002* (2013.01); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(56) References Cited

U.S. PATENT DOCUMENTS

| | | | |
|---|---|---|---|
| 5,487,153 A | | 1/1996 | Hammerstrom et al. |
| 5,524,175 A | | 6/1996 | Sato et al. |
| 5,644,749 A | | 7/1997 | Obayashi |
| 5,859,990 A | | 1/1999 | Yarch |
| 5,933,654 A | | 8/1999 | Galdun et al. |
| 6,006,325 A | * | 12/1999 | Burger ............... G06F 9/30087 712/214 |
| 6,307,867 B1 | | 10/2001 | Roobol et al. |
| 6,654,730 B1 | | 11/2003 | Kato et al. |
| 6,785,239 B1 | | 8/2004 | Tasker |
| 6,990,079 B2 | | 1/2006 | Vrabel |
| 7,012,893 B2 | | 3/2006 | Bahadiroglu |
| 7,480,640 B1 | | 1/2009 | Elad et al. |
| 7,539,608 B1 | | 5/2009 | Dageville et al. |
| 7,694,084 B2 | | 4/2010 | Raghavan et al. |
| 8,244,953 B1 | | 8/2012 | Kumar |
| 8,442,927 B2 | | 5/2013 | Chakradhar et al. |
| 8,892,488 B2 | | 11/2014 | Qi et al. |
| 8,966,413 B2 | | 2/2015 | Shacham et al. |
| 9,015,096 B2 | | 4/2015 | Hunzinger |
| 9,143,393 B1 | | 9/2015 | Bird et al. |
| 9,378,044 B1 | | 6/2016 | Gaurav et al. |
| 9,851,771 B2 | | 12/2017 | Cooper et al. |
| 9,990,307 B1 | | 6/2018 | Patel et al. |
| 10,275,001 B2 | | 4/2019 | Kam et al. |
| 2002/0133648 A1 | | 9/2002 | Goudie et al. |
| 2003/0065631 A1 | | 4/2003 | Mcbride |
| 2003/0120799 A1 | | 6/2003 | Lahav et al. |
| 2003/0200315 A1 | | 10/2003 | Goldenberg et al. |
| 2004/0187135 A1 | | 9/2004 | Pronovost et al. |
| 2005/0204189 A1 | | 9/2005 | Akiba |
| 2005/0216616 A1 | | 9/2005 | Eldar et al. |
| 2006/0047864 A1 | | 3/2006 | Brokenshire et al. |
| 2007/0145151 A1 | | 6/2007 | Nakamura et al. |
| 2008/0043742 A1 | | 2/2008 | Pong et al. |
| 2008/0052441 A1 | | 2/2008 | Freking et al. |
| 2008/0112438 A1 | | 5/2008 | Ying et al. |
| 2008/0313385 A1 | | 12/2008 | Vijayakumar et al. |
| 2008/0319933 A1 | | 12/2008 | Moussa et al. |
| 2009/0037697 A1 | | 2/2009 | Ramani et al. |
| 2009/0313195 A1 | | 12/2009 | McDaid et al. |
| 2010/0180100 A1 | | 7/2010 | Lu et al. |
| 2010/0257174 A1 | | 10/2010 | Minuti |
| 2010/0281192 A1 | | 11/2010 | Rakib et al. |
| 2011/0246722 A1 | | 10/2011 | Taha et al. |
| 2012/0130928 A1 | | 5/2012 | Bell et al. |
| 2012/0134449 A1 | | 5/2012 | Chen et al. |
| 2014/0046882 A1 | | 2/2014 | Wood |
| 2014/0181464 A1 | | 6/2014 | Forsyth et al. |
| 2014/0281221 A1 | | 9/2014 | Wang et al. |
| 2014/0372670 A1 | | 12/2014 | Vasilyuk |
| 2015/0363239 A1 | | 12/2015 | Hsu et al. |
| 2016/0098388 A1 | | 4/2016 | Blevins et al. |
| 2016/0184587 A1 | | 6/2016 | Heuvel et al. |
| 2016/0267377 A1 | | 9/2016 | Pan et al. |
| 2016/0328644 A1 | | 11/2016 | Lin et al. |
| 2016/0335119 A1 | | 11/2016 | Merrill et al. |
| 2016/0350653 A1 | | 12/2016 | Socher et al. |
| 2017/0011288 A1 | | 1/2017 | Brothers et al. |
| 2017/0199902 A1 | | 7/2017 | Mishra et al. |
| 2018/0299943 A1 | | 10/2018 | Mcbride et al. |
| 2018/0300601 A1 | | 10/2018 | Cedola et al. |
| 2018/0300602 A1 | | 10/2018 | Petre et al. |
| 2018/0300603 A1 | | 10/2018 | Ambardekar et al. |
| 2018/0300605 A1 | | 10/2018 | Ambardekar et al. |
| 2018/0300606 A1 | | 10/2018 | Corkery et al. |
| 2018/0300607 A1 | | 10/2018 | Petre et al. |
| 2018/0300613 A1 | | 10/2018 | Petre et al. |
| 2018/0300614 A1 | | 10/2018 | Ambardekar et al. |
| 2018/0300615 A1 | | 10/2018 | Ambardekar et al. |
| 2018/0300616 A1 | | 10/2018 | Ambardekar et al. |
| 2018/0300617 A1 | | 10/2018 | Mcbride et al. |
| 2018/0300633 A1 | | 10/2018 | Mcbride et al. |
| 2018/0300634 A1 | | 10/2018 | Mcbride et al. |
| 2020/0233820 A1 | | 7/2020 | Mcbride et al. |

FOREIGN PATENT DOCUMENTS

| | | |
|---|---|---|
| EP | 3035204 A1 | 6/2016 |
| EP | 3035249 A1 | 6/2016 |
| WO | 1993014459 A1 | 7/1993 |
| WO | 2016118257 A1 | 7/2016 |
| WO | 2016210030 A1 | 12/2016 |

OTHER PUBLICATIONS

Kim, Changkyu, et al. "Composable lightweight processors." 40th Annual IEEE/ACM International Symposium on Microarchitecture (MICRO 2007). IEEE, 2007. (Year: 2007).*

(56) References Cited

OTHER PUBLICATIONS

"Non Final Office Action Issued in U.S. Appl. No. 15/702,311", dated Jun. 29, 2018, 10 Pages.
"International Search Report and Written Opinion Issued in PCT Application No. PCT/US2018/026358", dated Jul. 11, 2018, 15 Pages.
"International Search Report and Written Opinion Issued in PCT Application No. PCT/US2018/026352", dated Jun. 27, 2018, 11 Pages.
"International Search Report and Written Opinion Issued in PCT Application No. PCT/US2018/026353", dated Jul. 6, 2018, 15 Pages
"International Search Report and Written Opinion Issued in PCT Application No. PCT/US2018/026354", dated Jul. 31, 2018, 15 Pages.
"International Search Report and Written Opinion Issued in PCT Application No. PCT/US2018/026355", dated Jul. 9, 2018, 16 Pages.
"International Search Report and Written Opinion Issued in PCT Application No. PCT/US2018/026356", dated Jul. 6, 2018, 16 Pages.
"International Search Report and Written Opinion Issued in PCT Application No. PCT/US2018/026357", dated Jul. 9, 2018, 16 Pages.
"Final Office Action Issued in U.S. Appl. No. 15/702,311", dated Nov. 5, 2018, 12 Pages.
"International Search Report & Written Opinion Issued in PCT Patent Application No. PCT/US18/027674", dated Jul. 13, 2018, 13 Pages.
"International Search Report & Written Opinion Issued in PCT Patent Application No. PCT/US18/027680", dated Sep. 27, 2018, 13 Pages.
"International Search Report & Written Opinion Issued in PCT Patent Application No. PCT/US18/027828", dated Aug. 3, 2018, 11 Pages.
"International Search Report & Written Opinion Issued in PCT Patent Application No. PCT/US18/027834", dated Jul. 24, 2018, 11 Pages.
"International Search Report & Written Opinion Issued in PCT Patent Application No. PCT/US18/027836", dated Aug. 3, 2018, 14 Pages.
"International Search Report & Written Opinion Issued in PCT Patent Application No. PCT/US18/027837", dated Aug. 3, 2018, 10 Pages.
"International Search Report & Written Opinion Issued in PCT Patent Application No. PCT/US18/027840", dated Jul. 30, 2018, 9 Pages.
"Notice of Allowance Issued in U.S. Appl. No. 15/694,663", dated May 8, 2020, 9 Pages.
"Ex Parte Quayle Action Issued in U.S. Appl. No. 15/950,644", dated Sep. 23, 2019, 7 Pages.
"Notice of Allowance Issued in U.S. Appl. No. 15/702,311", dated Sep. 11, 2019, 6 Pages.
"Non Final Office Action Issued in U.S. Appl. No. 15/702,311", dated May 21, 2019, 12 Pages.
Chi, et al., "PRIME: A Novel Processing-in-memory Architecture for Neural Network Computation in ReRAM-based Main Memory", In Proceedings of ACM/IEEE 43rd Annual International Symposium on Computer Architecture, Jun. 18, 2016, 13 Pages.

* cited by examiner

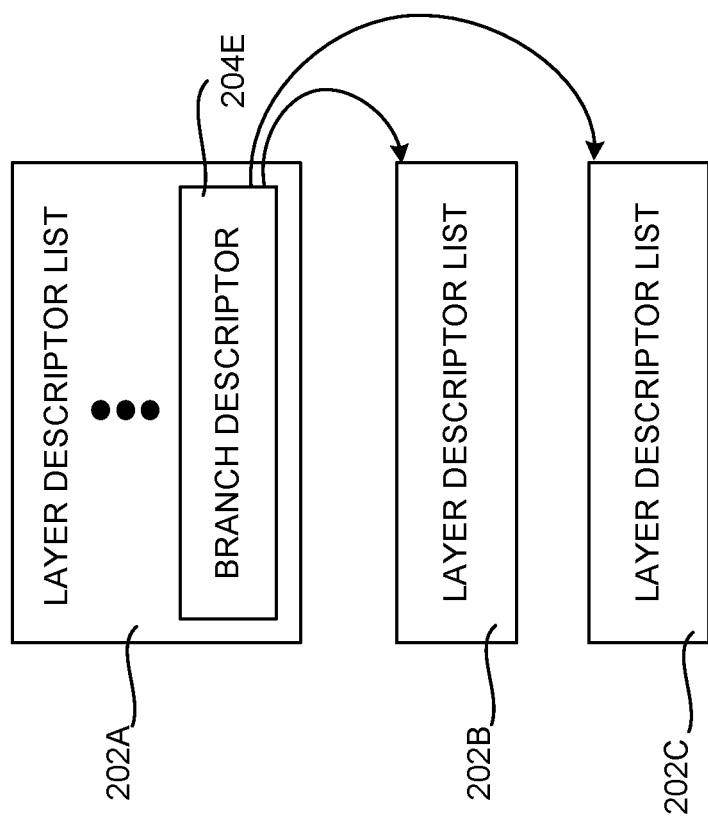

POWER-EFFICIENT DEEP NEURAL NETWORK MODULE CONFIGURED FOR LAYER AND OPERATION FENCING AND DEPENDENCY MANAGEMENT

CROSS-REFERENCE TO RELATED APPLICATIONS

This application claims priority under 35 U.S.C. § 119(e) to U.S. Provisional Patent Application No. 62/486,432, filed on Apr. 17, 2017 and titled "Enhanced Neural Network Designs," the entire disclosure of which is expressly incorporated in its entirety by reference herein.

BACKGROUND

Deep neural networks ("DNNs") are loosely modeled after information processing and communication patterns in biological nervous systems, such as the human brain. DNNs can be utilized to solve complex classification problems such as, but not limited to, object detection, semantic labeling, and feature extraction. As a result, DNNs form the foundation for many artificial intelligence ("AI") applications, such as computer vision, speech recognition, and machine translation. DNNs can match or exceed human accuracy in many of these domains.

The high-level of performance of DNNs stems from their ability to extract high-level features from input data after using statistical learning over a large data set to obtain an effective representation of an input space. However, the superior performance of DNNs comes at the cost of high computational complexity. High performance general-purpose processors, such as graphics processing units ("GPUs"), are commonly utilized to provide the high level of computational performance required by many DNN applications.

While general-purpose processors, like GPUs, can provide a high level of computational performance for implementing DNNs, these types of processors are typically unsuitable for use in performing DNN operations over long durations in computing devices where low power consumption is critical. For example, general-purpose processors, such as GPUs, can be unsuitable for use in performing long-running DNN tasks in battery-powered portable devices, like smartphones or alternate/virtual reality ("AR/VR") devices, where the reduced power consumption is required to extend battery life.

Reduced power consumption while performing continuous DNN tasks, such as detection of human movement, can also be important in non-battery-powered devices, such as a power-over-Ethernet ("POE") security camera for example. In this specific example, POE switches can provide only a limited amount of power, and reducing the power consumption of POE devices like security cameras permits the use of POE switches that provide less power.

Application-specific integrated circuits ("ASICs") have been developed that can provide performant DNN processing while at the same time reducing power consumption as compared to general-purpose processors. Despite advances in this area, however, there is a continued need to improve the performance and reduce the power consumption of ASICs that perform DNN processing, particularly for use in computing devices where the low power consumption is critical.

It is with respect to these and other technical challenges that the disclosure made herein is presented.

SUMMARY

A neural network module, or processor, is disclosed that can execute layer descriptors (which might be referred to herein as "descriptors") in a layer descriptor list in a manner that reduces latency during the performance of DNN calculations. The disclosed neural network module can also implement functions for managing the flow of descriptors through the DNN module. Through an implementation of the disclosed technologies, the flow of descriptors through the DNN module can be optimized, thereby enabling the DNN module to complete its processing faster. Faster completion of processing can enable the DNN module to be turned off earlier, thereby saving power. Other technical benefits not specifically mentioned herein can also be realized through implementations of the disclosed subject matter.

In order to realize the technical benefits mentioned briefly above, and potentially others, a DNN module is disclosed that is capable of retrieving and executing descriptors contained in layer descriptor lists in order to implement DNNs. Layer descriptor lists (which might be referred to herein as "descriptor lists") are pre-compiled by software, such as a compiler, and include instructions for performing a forward pass of a neural network by the DNN module.

The descriptors in a descriptor list can also be utilized to configure aspects of the operation of the DNN module, including configuration of the neurons in the DNN module for implementing a neural network. In one embodiment, descriptor lists are stored in the main memory of a computing device acting as a host for the DNN module and loaded by the DNN module for on-the-fly execution.

Descriptor lists can include several types of DNN layer descriptors (which may be referred to herein as "descriptors"): memory-to-memory move ("M2M") descriptors; operation descriptors; host communication descriptors; configuration descriptors; branch descriptors; and synchronization descriptors. The configuration and operation of each of these descriptor types are described in detail below.

As indicated above, the disclosed DNN module can also be configured for layer and operation fencing and dependency management. In particular, the layer descriptors described above can be utilized to manage the flow of descriptors through the DNN module. For example, layer descriptors can define dependencies upon other descriptors. Each descriptor can include a unique identification ("ID") label that is carried with the descriptor throughout the processing pipeline. When the descriptor is finished processing, the ID of the descriptor is placed in a register that indicates the most recently completed descriptor for the descriptor type. Each descriptor type can have a separate register for tracking IDs associated with completed layer descriptors.

If a layer descriptor specifies a dependency upon another layer descriptor, the DNN module compares the layer ID of the last descriptor completed to the ID of the descriptor upon which the current descriptor is dependent. If the last completed descriptor ID is higher than the ID of the descriptor upon which the current descriptor is dependent, then the current descriptor can start processing because the dependency has been satisfied. However, if the ID of the last completed descriptor is lower than the ID of the descriptor upon which the current descriptor is dependent, then the current descriptor is stalled until its dependency is satisfied.

Layer descriptors can also define a "fence," or barrier, function that is used to prevent the processing of upstream layer descriptors until the processing of all downstream layer descriptors is complete. For example, an M2M descriptor can specify, by way of a fence bit in one embodiment, that it is not to be processed until all descriptors ahead of it have completed and received the write response for their completion store. The fence bit guarantees that there are no other layer descriptors in the DNN processing pipeline before processing the layer descriptor that has the fence to be asserted.

As will be described in greater detail below, M2M descriptors are buffered separately from operation descriptors and can be executed at soon as possible, subject to explicitly set dependencies. As a result, the latency typically incurred in obtaining data for processing by neurons in a DNN module can be reduced and, consequently, the neurons can complete their processing faster than they otherwise would have. The DNN module can then be powered down earlier than it otherwise would have, thereby saving power.

As will also be described in greater detail below, the disclosed technologies can enable the flow of descriptors through a DNN module to be optimized, thereby enabling the DNN module to complete its processing faster and thereby saving power. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 3 is a data structure diagram showing additional aspects of the layer descriptor list illustrated in FIG. 2, according to one embodiment;

DETAILED DESCRIPTION

Figure 1:
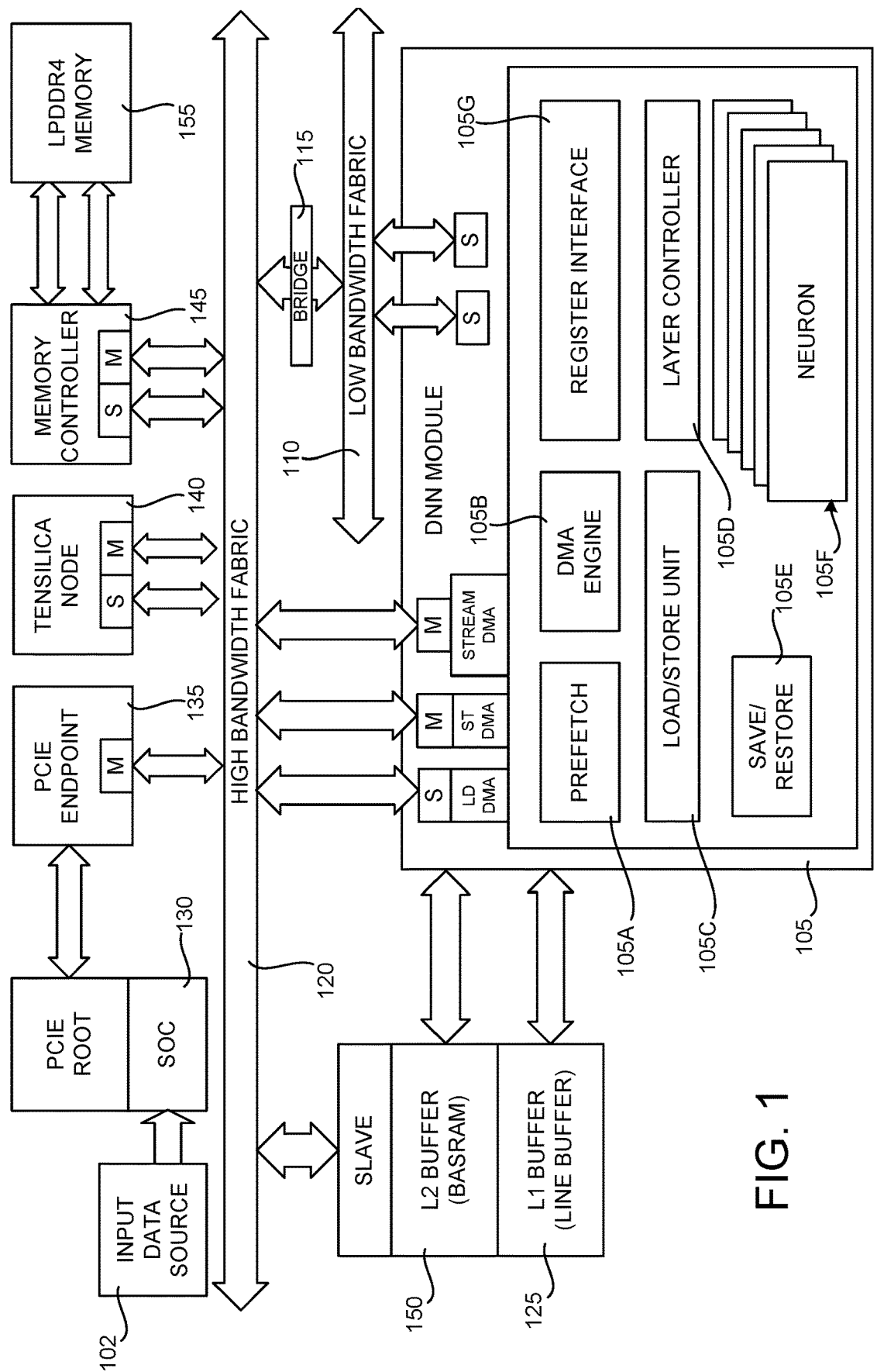
FIG. 1 is a computing architecture diagram that shows aspects of the configuration and operation of a DNN module that can implement the technologies disclosed herein, according to one embodiment.

The following detailed description is directed to a neural network module that can execute descriptors in a layer descriptor list to efficiently perform DNN calculations. As discussed above, the DNN module can also implement functions for managing the flow of descriptors through the DNN module. Through an implementation of the disclosed technologies, the flow of descriptors through the DNN module can be optimized, thereby enabling the DNN module to complete its processing faster. Faster completion of processing can enable the DNN module to be turned off earlier, thereby saving power. Other technical benefits not specifically mentioned herein can also be realized through implementations of the disclosed subject matter.

While the subject matter described herein is presented in the general context of a hardware DNN module, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of a neural network module that can execute descriptors in a layer descriptor list to efficiently perform DNN calculations will be described.

FIG. 1 is a computing architecture diagram that shows aspects of the configuration and operation of a DNN module 105 that implements the technologies disclosed herein, according to one embodiment. The DNN module 105 disclosed herein is configured in some embodiments to solve classification problems (and related problems) such as, but not limited to, object detection, semantic labeling, and feature extraction.

In order to provide this functionality, the DNN module 105 can implement a recall-only neural network and programmatically support a wide variety of network structures. Training for the network implemented by the DNN module 105 can be performed offline in a server farm, data center, or another suitable computing environment. The result of training a DNN is a set of parameters that can be known as "weights" or "kernels." These parameters represent a transform function that can be applied to an input with the result being a classification or semantically labeled output.

The DNN module 105 disclosed herein can be considered a superscalar processor. The DNN module 105 can dispatch one or more instructions to multiple execution units, called neurons 105F. The execution units can be "simultaneous dispatch simultaneous complete," where each execution unit is synchronized with each of the other execution units. The DNN module 105 can be classified as a single instruction stream, multiple data stream ("SIMD") architecture.

The DNN module 105 includes a number of neurons 105F (e.g. a power of two). A neuron 105F is the base unit in artificial neural networks that is used to model a biological neuron in the brain. The model of a neuron 105F can include the inner product of an input vector with a weight vector added to a bias, with a non-linearity applied. The processing performed by a neuron 105F in the DNN module 105 described herein is closely mapped to an artificial neuron.

Each neuron 105F in the DNN module 105 is capable of performing weighted sum, max pooling, bypass, and potentially other types of operations. The neurons 105F process input and weight data every clock cycle. Each neuron 105F is synchronized to all other neurons 105F in terms of progress within a kernel to minimize the flow of kernel data within the DNN module 105.

Each neuron 105F can contain a multiplier, an adder, a comparator, and a number of accumulators (not shown in FIG. 1). By having multiple accumulators, the neurons 105F can maintain context for multiple different active kernels at a time. Each accumulator is capable of being loaded from a read of the BaSRAM 150 (described below). The accumulators can sum themselves with the contents of other accumulators from other neurons 105F.

The DNN module 105 accepts planar data as input, such as image data. Input to the DNN module 105 is not, however, limited to image data. Rather, the DNN module 105 can operate on any input data presented to the DNN module 105 in a uniform planar format. In one particular embodiment, the DNN module 105 can accept as input multi-planar one-byte or two-byte data frames.

Each input frame can be convolved with an N×K×H×W set of kernels, where N is the number of kernels, K is the number of channels per kernel, H is the height, and W is the width. Convolution is performed on overlapping intervals across the input data where the interval is defined by strides in the X and Y directions. These functions are performed by the neurons 105F and managed by the DNN module 105 and software-visible control registers.

The DNN module 105 supports three main data types: weights; input data/feature maps; and activation data. Input data/feature maps and activation data are, in most cases, two names for the same data with the distinction that when referring to an output of a layer the term activation data is used. When referring to the input of a layer the term input data/feature map is used.

The neurons 105F in the DNN module 105 compute a weighted sum of their inputs and pass the weighted sum through an "activation function" or "transfer function." The transfer function commonly has a sigmoid shape but might also take on the form of a piecewise linear function, step function, or another type of function. The activation function allows the neurons 105F to train to a larger set of inputs and desired outputs where classification boundaries are non-linear.

The DNN module 105 operates on a list of layer descriptors which correspond to the layers of a neural network. The list of layer descriptors can be treated by the DNN module 105 as instructions. These descriptors can be pre-fetched from memory into the DNN module 105 and executed in order. The descriptor list acts as a set of instructions to the DNN module 105. Software tools and/or compilers can be executed on devices external to the DNN module 105 to create the descriptor lists that are executed on the DNN module 105.

Generally, there can be two main classes of descriptors: M2M descriptors; and operation descriptors. M2M descriptors can be used to move data to/from the main memory to/from a local buffer (i.e. the line buffer 125 described below) for consumption by the operation descriptors. M2M descriptors follow a different execution pipeline than the operation descriptors. The target pipeline for M2M descriptors can be the internal DMA engine 105B or the configuration registers 105G, whereas the target pipeline for the operation descriptors can be the neurons 105F.

Operation descriptors include data defining a specific operation that the neurons 105F should perform on a data structure located in local static random access memory ("SRAM") memory. The operation descriptors are processed in order and are capable of many different layer operations, at least some of which are described herein. Additional details regarding the M2M descriptors, the operation descriptors, and several other types of descriptors along with mechanisms for executing the descriptors will be provided below with regard to FIGS. 2-6.

As illustrated in FIG. 1, the DNN module 105 has a memory subsystem with a unique L1 and L2 buffer structure. The L1 and L2 buffers shown in FIG. 1 are designed specifically for neural network processing. By way of example, the L2 buffer 150 can maintain a selected storage capacity (e.g., one megabyte (1 MB)) with a high speed private interface operating at a selected frequency (e.g., sixteen giga-bits per second (16 GBps)). The L1 buffer 125 can maintain a selected storage capacity (e.g., eight kilo-bytes (8 KB)) that can be split between kernel and activation data. The L1 buffer 125 might be referred to herein as the "line buffer 125," and the L2 buffer 150 might be referred to herein as the BaSRAM 150.

Computational data (i.e. input data, weights and activation data) is stored in the BaSRAM 150 row-major in some embodiments. The computational data can be organized as two line buffers, where one line buffer contains input data, which might be referred to herein as the "input buffer," and the other line buffer, which might be referred to herein as the "weight buffer," contains kernel weights. The line buffers are filled from the BaSRAM 150 by the load/store unit 105C. Data is accumulated in each line buffer until it has reached its predetermined capacity. The line buffer data is then copied to a shadow buffer in some embodiments and presented to the neurons 105F.

The DNN module 105 can also comprise other components including, but not limited to, a register interface 105G, a prefetch unit 105A, a save/restore unit 105E, a layer controller 105D, and a register interface 105G. The DNN module 105 can include additional or alternate components in some embodiments.

The DNN module 105 operates in conjunction with other external computing components in some configurations. For example, the DNN module 105 is connected to a host application processor system on chip ("the host SoC") 130 in some embodiments. The DNN module 105 can be connected to the host SoC 130 through a PCIe interface, for example. Appropriate PCIe components, such as the PCIe endpoint 135 can be utilized to enable these connections.

The host SoC 130 serves as the application processor for the DNN module 105 in some embodiments. The main operating system, application, and auxiliary sensor processing are performed by the host SoC 130. The host SoC 130 can also be connected to an input data source 102, such as an external camera, that provides input data, such as image data, to the DNN module 105.

DDR DRAM 155 can also be connected to the host SoC 130 that can be used as the main system memory. This memory is accessible from the host SoC 130 across the high bandwidth fabric 120 (e.g. PCIe bus) by way of a memory controller 145. The high bandwidth fabric 120 provides bidirectional direct memory access ("DMA") small messaging transactions and larger DMA transactions. A bridge 115 and low bandwidth fabric 110 can connect the DNN module 105 to the host SoC 130 for sub-module configuration and other functions.

The DNN module 105 can include a DMA engine 105B that is configured to move data to and from main memory 155. The DMA engine 105B has two channels in some embodiments. One channel is dedicated to fetching operation descriptors while the other channel is dedicated to M2M operations. A DMA descriptor can be embedded in the M2M descriptor. Descriptors in this context are DMA descriptors that are used to move the contents of memory, not to be confused with the operation descriptors described herein.

To offload the local BaSRAM memory 150, and to provide more space for input data and weight data, the activation output can optionally be streamed directly to DDR memory 155. When streaming data to DDR memory 155, the DNN module 105 will accumulate enough data for a burst transaction on the high bandwidth fabric 120 and will buffer enough transactions to minimize backpressure on the neurons 105F. Additional details regarding the operation of the DNN module 105 will be provided below.

Figure 2:
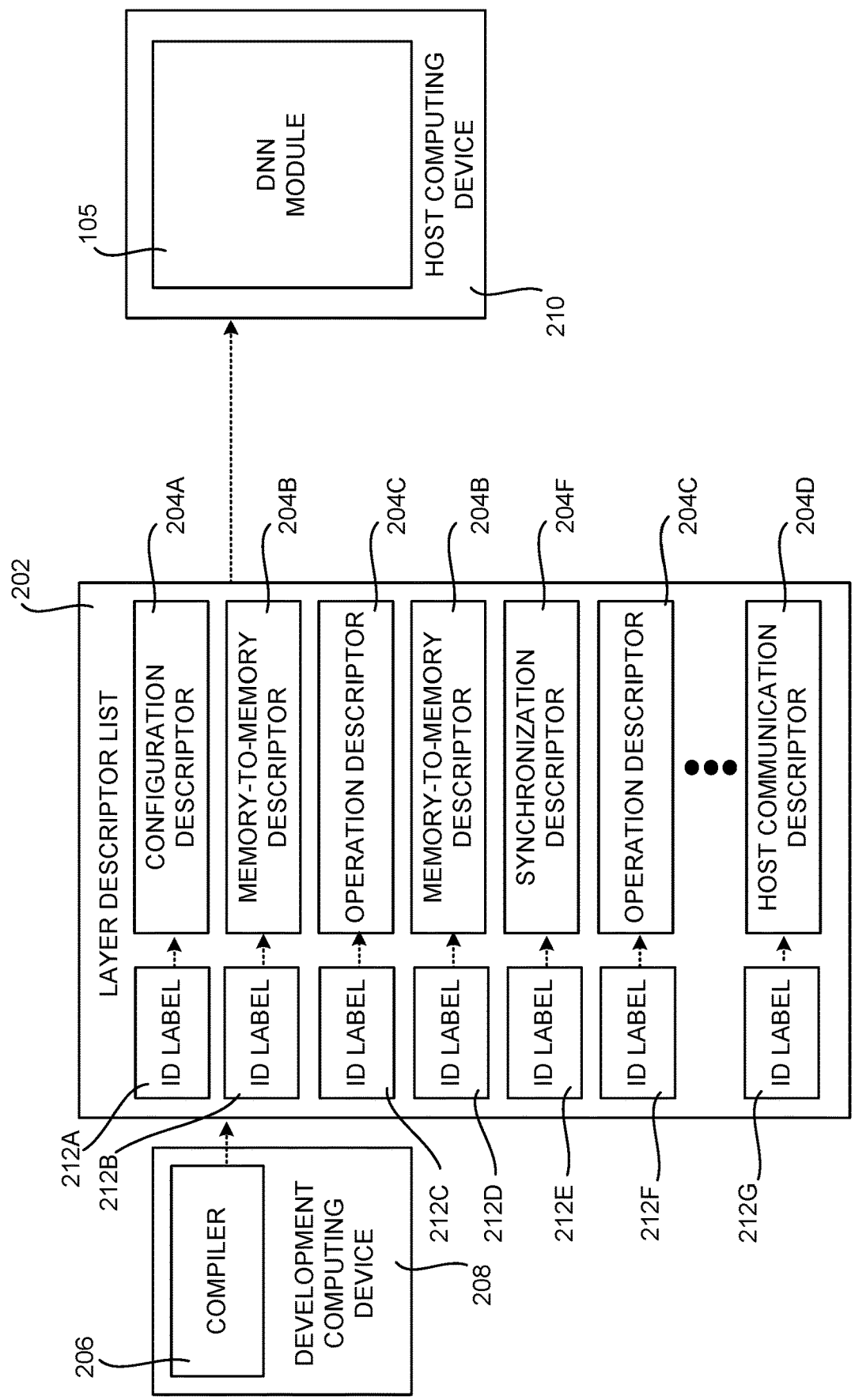
FIG. 2 is a computing system diagram that shows aspects of an illustrative environment for creating and executing a layer descriptor list, according to one embodiment.

FIG. 2 is a computing system diagram that shows aspects of an illustrative environment for creating and executing a layer descriptor list 202, according to one embodiment. As described briefly above, the DNN module 105 can retrieve and execute layer descriptors 204 contained in a layer descriptor list 202 to implement a DNN.

Layer descriptor lists 202 are pre-compiled by software, such as a compiler 206 executing on a development computing device 208, and correspond to the layers of a neural network. Layer descriptor lists 202 can be created on a development computing device 208, or in another environment, and deployed to the device 210 hosting the DNN module 105 (which might be referred to herein as the "host 210"). The DNN module 105 treats the layer descriptors 204 as instructions and can execute the layer descriptors 204 to perform a forward pass of a neural network.

In one embodiment, layer descriptor lists 202 are stored in the main memory of the host 210 and loaded by the DNN module for on-the-fly execution. The descriptors 204 can be pre-fetched from host 210 memory into the DNN module 105 and executed in order.

Layer descriptor lists 204 can include several types of DNN layer descriptors 204: M2M descriptors 204B; operation descriptors 204C; host communication descriptors 204D; configuration descriptors 204A; branch descriptors 204E (shown in FIG. 3 and described below); and synchronization descriptors 204F. Each of these descriptor types are described below. Other types of layer descriptors can be utilized in other embodiments.

M2M descriptors 204B can be used to move data to/from the main memory of the host computing device 210 to/from a local buffer (i.e. the line buffer 125 described below) for consumption by the operation descriptors 204, described below. In one embodiment, a DMA engine (not shown in FIG. 1) in the DNN module 105 utilizes M2M descriptors 204B to perform DMA operations.

M2M descriptors 204B include fields specifying parameters defining a multi-dimensional strided DMA operation to and from any memory address. For example, and without limitation, a M2M descriptor can be executed to transfer input data and weight data to be operated on by neurons 105F in the DNN module 105 from a memory of the host computing device 210 to a memory in the DNN module 105, such as a cache memory. M2M descriptors 204B include data that defines the parameters of such a memory transfer. Details regarding at least some of these parameters will be provided below with regard to FIG. 4B.

Operation descriptors 204C specify an operation that neurons 105F in the DNN module 105 should perform on data obtained by a M2M descriptor. For example, operation descriptors 204C can define the arithmetic operations to be performed by neurons 105F such as, but not limited to, additive combining, scalar multiply and add, convolution, deconvolution, max pooling, or a fully connected layer.

Operation descriptors 204C can also specify the activation function to be used by the neurons 105F such as, but not limited to, the ReLU activation function and look-up table-based activation functions, and the mathematical precision to be utilized by the neurons 105F when performing these operations.

Operation descriptors 204C can also include microcode for configuring aspects of the operation of the hardware of the DNN module 105. Operation descriptors 204C can include other fields containing data defining aspects of the configuration of the neurons 105F for implementing a DNN, some of which are described below with reference to FIG. 4A.

Configuration descriptors 204A enable the modification of a configuration state of the DNN module 105. For example, configuration descriptors 204A can be executed to configure how the DNN module 105 performs rounding operations, power management, or enabling and disabling neurons.

Host communication descriptors 204D enable the DNN module 105 to interrupt a host computing device 210 to provide status messages and/or other types of data. For example, the DNN module 105 might execute a host communication descriptor 204D to provide data to a host computing device 210 regarding the status or completion of a layer of a DNN.

Synchronization descriptors 204F can be utilized to synchronize the execution of multiple neurons 105F in the DNN module 105 by instructing the neurons 105F to pause their processing until the other neurons 105F of a neural network have completed their processing. Other types of descriptors can be defined and executed in other embodiments.

In one embodiment, the compiler 206 assigns a unique identification ID label 212 (which might be referred to as an "ID 212") to each descriptor 204. The ID label 212 is a monotonically increasing number that the compiler 206 assigns to each descriptor 204 based upon the descriptor's placement in a layer descriptor list 202.

In the example shown in FIG. 2, for instance, the configuration descriptor 204A will have the lowest ID label 212A of the descriptors 204 in the list 202. The ID label 212G for the descriptor 204D will have the highest label ID 212G of the descriptors 204 in the list 202.

As will be described in detail below with regard to FIGS. 4A and 4B, the label ID 212 is stored within the descriptors 204 in some embodiments. As will also be described in greater detail below, the label IDs 212 can be utilized to enforce dependencies and to perform fencing operations.

FIG. 3 is a data structure diagram that shows additional aspects of the layer descriptor list 202 illustrated in FIG. 2, according to one embodiment. In particular, FIG. 3 illustrates aspects of a layer descriptor list 202A that includes a branch descriptor 204E. Branch descriptors 204E enable execution to branch between descriptors 204 or layer descriptor lists 202 when a specified condition is satisfied.

In the example shown in FIG. 3, for instance, a branch descriptor 204E has been defined which, when executed, will branch execution to the head of the layer descriptor list 202B or the head of the layer descriptor list 202C based upon evaluation of a specified condition. Branching the execution of the descriptors 204 can be performed in other ways in other embodiments.

Figure 4A:
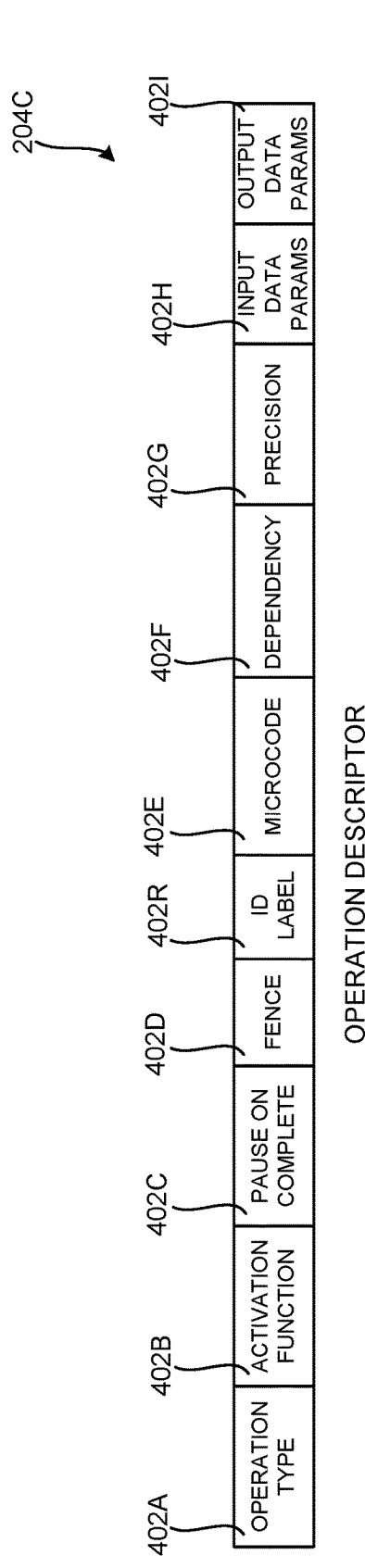
FIG. 4A is a data structure diagram that shows aspects of the configuration of an operation descriptor, according to one embodiment.

FIG. 4A is a data structure diagram that shows aspects of a configuration for an operation descriptor 204C, according to one embodiment. As illustrated in FIG. 4A, an operation descriptor 204C can include fields 402A-402I storing data defining a specific operation that neurons 105F in the DNN module 105 should perform on data obtained by execution of a M2M descriptor 204B. In one embodiment, the operation descriptor 204C is a 128-byte wide data structure that encodes this information. The operation descriptor 204C can be implemented in other ways in other embodiments.

In one embodiment, the operation descriptor 204C includes a field 402A storing data that defines a type of operation to be performed by the neurons 105F such as, but not limited to, additive combining, scalar multiply and add, convolution, deconvolution, max pooling, or a fully connected layer. The operation descriptor 204C can also include a field 402B storing data specifying the activation function to be used by the neurons 105F during the specified processing operation, such as but not limited to the ReLU activation function and look-up table-based activation functions. The operation descriptor 204C can also include a field 402G specifying the mathematical precision to be utilized by the neurons 105F when performing the operation.

Operation descriptors 204C can also include a field 402C that stores data instructing the neurons 105F to pause on completion of their processing. Operation descriptors 204C can also include a field 402D that stores data that will cause the DNN module 105 to prevent further processing of a descriptor 204 until all descriptors 204 ahead of it (i.e. having a lower ID label) have completed their processing and received a write response from their completion store (this process might be referred to herein as "fencing"). This can be used to ensure that no other descriptors 204 remain in the descriptor processing pipeline. The ID label 212 for operation descriptors 204 is stored in the field 402R in one embodiment. Additional details regarding the performance of a fencing operation is provided below with regard to FIGS. 7, 8, and 10.

Operation descriptors 204C can also include a field 402E that embeds microcode for use in configuring aspects of the operation of the hardware of the DNN module 105. For example, and without limitation, the microcode in the field 402E can be extracted by the DNN module 105 and executed to configure the hardware implementing the neurons 105F. As a specific example, the microcode can be executed to configure how convolution operations are to be performed, configure iterators, and/or to configure other aspects of the operation of the neurons 105F.

Operation descriptors 204C can also include a field 402F that stores data defining a dependency upon the completed execution of another descriptor 204. Having a dependency set means that a descriptor will not be executed until the descriptor identified in the field 402F has completed its operation. The field 402F can be set to zero to indicate that a descriptor 204 has no dependencies and that dependency checking should therefore be disabled for that descriptor 204.

In order to enable dependency checking, the DNN module 105 can maintain registers storing the ID label 212 of the most recently completed descriptor 204. Separate registers can be maintained that identify the most recently completed M2M descriptor 204B and the most recently completed operation descriptor 204C. The DNN module 105 will release dependencies and performing fencing based upon the values stored in these registers. Additional details regarding dependency management is provided below with regard to FIGS. 7, 9A-9C, and 10.

It is to be appreciated that since M2M descriptors 204B are executed in order, it is not necessary to set dependencies between two M2M descriptors 204B. Accordingly, execution of a M2M descriptor 204B can be dependent upon completion of the execution of an operation descriptor 204C and execution of an operation descriptor 204C can be dependent upon the completion of the execution of a M2M descriptor 204B. The execution of an operation descriptor 204B can also be dependent upon the completion of another operation descriptor 204B in some scenarios.

M2M descriptors 204B and operation descriptors 204C can also be dependent upon the completed execution of the other descriptor types identified above. For instance, in the example shown in FIG. 2, execution of the M2M descriptor 204B might be dependent upon the completed execution of the configuration descriptor 204A. Similarly, execution of the host communication descriptor 204D might be dependent upon the completed execution of the second operation descriptor 204C. The different types of descriptors 204 identified above can be dependent upon one another in embodiments disclosed herein.

Operation descriptors 204C can also include a fields 402H and 402I that store data defining aspects of the input data to the operation and the output data (which might be referred to herein as "blobs") generated by the operation. These fields might include, for instance, data identifying memory addresses for the input and output data, the dimensions of the input and output data, precision of the input and output data, feature count, height and width of the input data, channel count, height and width of the output data, padding configuration, and striding configuration. Other aspects of the input and output data can be specified in the operation descriptor 204C in other embodiments.

It is to be appreciated that the fields 402A-402I are merely illustrative. Operation descriptors 204C can include additional or alternative fields in other embodiments that store data defining other aspects of an operation to be performed by the neurons 105F for implementing a DNN.

Figure 4B:
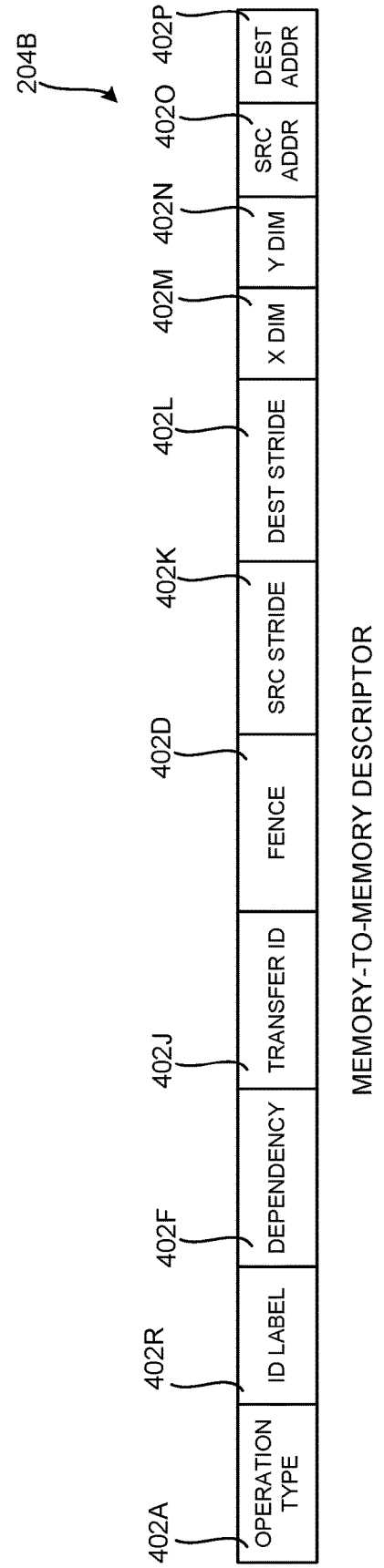
FIG. 4B is a data structure diagram that shows aspects of the configuration of a M2M descriptor, according to one embodiment.

FIG. 4B is a data structure diagram that shows aspects of the configuration of an M2M descriptor 204B, according to one embodiment. As discussed above, M2M descriptors 204B include fields specifying parameters that define a multi-dimensional strided DMA operation to and from any memory address. In one embodiment, the M2M descriptor 204B is a 128-byte wide data structure that encodes this information. The M2M descriptor 204B can be implemented in other ways in other embodiments.

In one embodiment, the M2M descriptor 204B includes a field 402A indicating that the descriptor is a M2M descriptor 204B. The M2M descriptor 204B can also include a field 402R storing an ID label 212 such as that described above for the M2M descriptor 204B. The M2M descriptor 204B can also include a field 402F specifying a dependency upon the completed execution of another descriptor 204, also in the manner described above. Similarly, the M2M descriptor 204B can include a field 402D that stores data that will cause the DNN module 105 to prevent further processing of the descriptor 204B until all descriptors 204 ahead of it have completed their processing and received a write response from their completion store (i.e. the fencing operation described above). Additional details regarding these fencing and dependency management operations will be provided below with regard to FIGS. 7-10.

The M2M descriptor 204B can also include a field 402J specifying a user-defined transfer ID. By storing a unique number in this field and monitoring the corresponding field in an operation status register of the DNN module 105, software can identify the currently executing transfer.

The M2M descriptor 204B can also include fields 402K-402P specifying aspects of the data to be transferred. For example, and without limitation, these fields can store data identifying a source stride (i.e. the number of bytes between the first bytes of consecutive rows of a DMA transfer), destination stride, size of the operation in the X and Y dimensions, source memory address, and destination memory address, respectively. M2M descriptors 204B can include additional or alternative fields in other embodiments that store data defining other aspects of an M2M operation.

Figure 5:
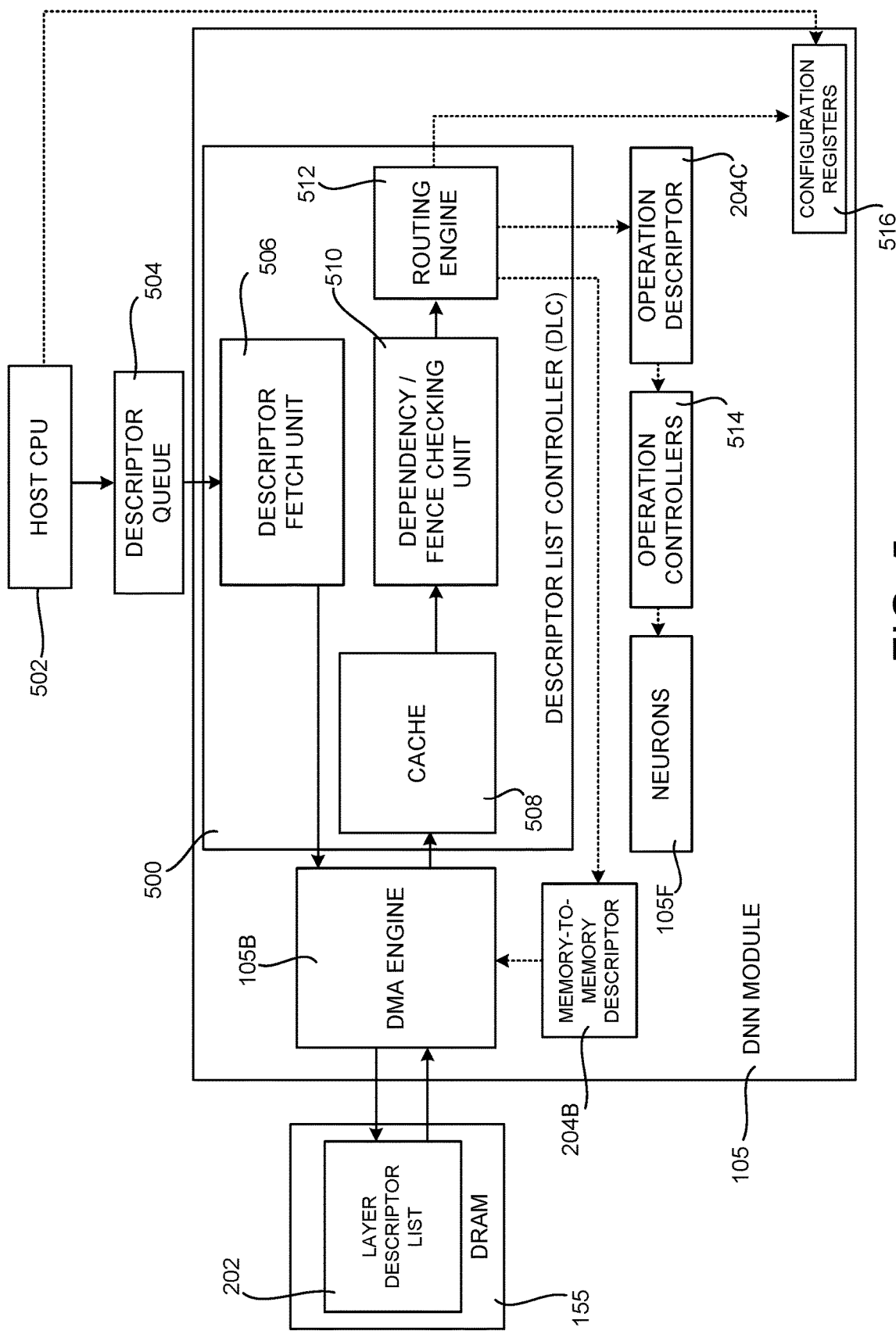
FIG. 5 is a computing architecture diagram that shows details regarding the configuration of a DNN module capable of executing descriptors in a layer descriptor list, according to one embodiment.

FIG. 5 is a computing architecture diagram that shows details regarding the configuration of a DNN module 105 configured to execute descriptors 204 in a layer descriptor list 202, according to one embodiment. In this embodiment, the DNN module 105 includes a descriptor list controller ("DLC") 500 that performs operations for retrieving and routing descriptors 204 in a layer descriptor list 202.

As illustrated in FIG. 5, a host CPU 502 (i.e. a CPU in the host computing device 210) provides the DLC 500 with data identifying a layer descriptor list 202 to be executed. This data is stored in a descriptor queue 504 in one embodiment. A descriptor fetch unit 506, in turn, retrieves the data from the descriptor queue 504 and instructs the DMA engine 105B to retrieve the identified layer descriptor list 202. The DMA engine 105B retrieves the layer descriptor list 202 from the DRAM 155 of the host computer 210 and stores the layer descriptor list 202 in a cache 508 provided by the DLC 500.

In some embodiments, a dependency/fence checking unit 510 retrieves descriptors 204 from the cache 508 and enforces the fence and dependency checks described above. Details regarding these processing operations will be provided below with regard to FIGS. 7-10. Following processing by the dependency/fence checking unit 510, descriptors 204 in the layer descriptor list 202 are provided to a routing engine 512.

The routing engine 512 routes different types of descriptors to different pipelines. For instance, in the example shown in FIG. 5, the routing engine 512 has routed a M2M descriptor 204B to the DMA engine 105B. As discussed above, the DMA engine 105B can utilize the contents of the M2M descriptor 204B to transfer input data and weight data to be operated on by neurons 105F in the DNN module 105 from a memory of the host computing device 210 to a memory in the DNN module 105, such as a cache.

In the example shown in FIG. 5, the routing engine 512 has also routed an operation descriptor 204C to the operation controllers 514 for execution. The operation controllers 514 will utilize the operation descriptor 204C to configure the neurons 105F. Once configured, the neurons 105F can process the data retrieved through the execution of the M2M descriptor 204B. This process can be repeated for additional descriptors 204 such as those described above, and additional layer descriptor lists 202. Additional details regarding the processing pipelines implemented by the DLC 500 are discussed in greater detail below with regard to FIG. 7.

As also shown in FIG. 5, the routing engine 512 can utilize configuration descriptors 204A to set the state of the configuration registers 516, which define the configuration for the DNN module 105. As also shown in FIG. 5, the host CPU 502 can also independently access the configuration registers 516 to set or retrieve the configuration state of the DNN module 105. For example, the host CPU 502 might set the configuration registers 516 in a manner that causes the DNN module 105 to power itself down following completion of DNN processing. The host CPU 502 can utilize the configuration registers 516 to set other aspects of the configuration state of the DNN module 105 in other embodiments. The registers 516 can be outside of a power island containing the DNN module 105 in order to allow the host 210 to access the registers 516 when the DNN module 105 is powered down.

As discussed above, and further below with regard to FIG. 7, the DLC 500 buffers M2M descriptors 204B separately from operation descriptors 204C. In this manner, the M2M descriptors 204B can be executed as soon as possible, subject to explicitly set dependencies. As a result, the latency typically incurred in obtaining data for processing by neurons 105F in the DNN module 105 can be reduced and, consequently, the neurons 105F can complete their processing faster than they otherwise would have. The DNN module 105 can then be powered down earlier than it otherwise would have, thereby saving power. Other technical benefits not specifically identified herein can also be realized through implementations of the disclosed technologies.

Figure 6:
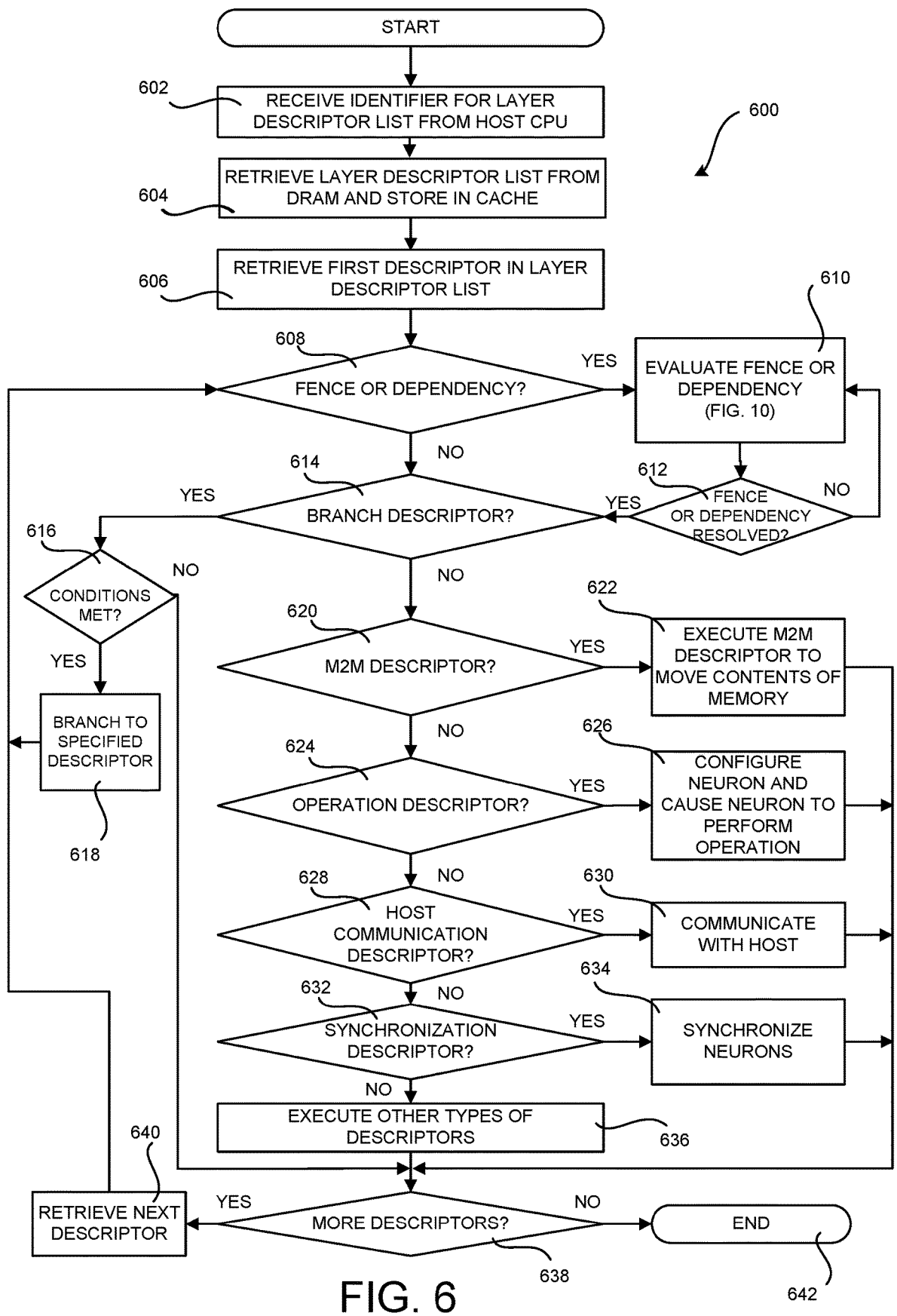
FIG. 6 is a flow diagram showing a routine that illustrates aspects of the operation of a DNN module for executing descriptors in a layer descriptor list, according to one embodiment disclosed herein.

FIG. 6 is a flow diagram showing a routine 600 that illustrates aspects of the operation of the DNN module 105 described with reference to FIGS. 1-5 for executing descriptors 204 in a layer descriptor list 202, according to one embodiment disclosed herein. It should be appreciated that the logical operations described herein with regard to FIG. 6, and the other FIGS., can be implemented (1) as a sequence of computer implemented acts or program modules running on a computing device and/or (2) as interconnected machine logic circuits or circuit modules within a computing device such as the DNN module 105.

The particular implementation of the technologies disclosed herein is a matter of choice dependent on the performance and other requirements of the computing device.

Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 600 begins at operation 602, where the DLC 500 receives data from the host CPU 502 describing the location of a descriptor list 202 in the host DRAM 155. This data is placed in the descriptor queue 504. The routine 600 then proceeds from operation 602 to operation 604, where the descriptor fetch unit 506 instructs the DMA engine 105B to retrieve the layer descriptor list 202 from the host DRAM 155. The DMA engine 105B, in turn, retrieves the layer descriptor list 202 and stores the list 202 in the cache 508. The routine 600 then proceeds from operation 604 to operation 606.

At operation 606, the first descriptor 204 in the descriptor list 202 is retrieved from the cache 508. The routine 600 then proceeds to operation 608, where the dependency/fence checking unit 510 determines whether the descriptor 204 indicates a fence or dependency. If so, the routine 600 proceeds from operation 608 to operation 610, where the dependency/fence checking unit 510 determines if the specified fence or dependency condition, or conditions, has been satisfied. If so, the routine 600 branches from operation 612 to operation 614. If, at operation 608, the dependency/fence checking unit 510 determines that the descriptor 204 does not indicate a fence or dependency, the routine 600 proceeds from operation 608 to operation 614. Details regarding the processing operations for performing dependency and fence checking are provided below with regard to FIGS. 7-10.

At operation 614, the routing engine 512 determines whether the current descriptor 204 is a branch descriptor 204E. If so, the routine 600 proceeds from operation 614 to operation 616, where a determination is made as to whether the condition specified by the branch descriptor 204E has been met. If so, the routine 600 proceeds from operation 616 to operation 618, where execution of the descriptors 204 branches to the descriptor 204 identified by the branch descriptor 204E. The routine 600 then proceeds from operation 618 back to operation 608, where the next descriptor 204 can be processed.

If, at operation 614, the routing engine 512 determines that the current descriptor 204 is not a branch descriptor 204E, the routine 600 proceeds from operation 614 to operation 620. At operation 620, the routing engine 512 determines if the current descriptor 204 is a M2M descriptor 204B. If so, the routine 600 proceeds from operation 614 to operation 622, where the routing engine 512 routes the current descriptor 204B to the DMA engine 105B in order to perform the specified M2M operation. If the current descriptor 204 is not a M2M descriptor 204B, the routine 600 proceeds from operation 620 to operation 624.

At operation 624, the routing engine 512 determines if the current descriptor 204 is an operation descriptor 204C. If so, the routine 600 proceeds from operation 624 to operation 626, where the routing engine 512 routes the current descriptor 204C to the operation controllers 514 in order to configure the neurons 105F and perform the processing operation specified by the operation descriptor 204C. If the current descriptor 204 is not an operation descriptor 204C, the routine 600 proceeds from operation 624 to operation 628.

At operation 628, the routing engine 512 determines if the current descriptor 204 is a host communication descriptor 204D. If so, the routine 600 proceeds from operation 628 to operation 630, where the host 210 can be interrupted in order to transmit data from the DNN module 104 to the host 210. If the current descriptor 204 is not a host communication descriptor 204D, the routine 600 proceeds from operation 628 to operation 632.

At operation 632, the routing engine 512 determines if the current descriptor 204 is a synchronization descriptor. If so, the routine 600 proceeds from operation 632 to operation 634, where operation controllers 514 synchronize the neurons 105F in the manner described above. If the current descriptor 204 is not synchronization descriptor, the routine 600 proceeds from operation 632 to operation 636, where other descriptor types can be executed. The routine 600 then proceeds from operation 636 to operation 638.

At operation 638, the DLC 500 determines if there are additional descriptors 204 in the descriptor list 202 to be executed. If not, the routine 600 proceeds from operation 638 to operation 642, where it ends. If additional descriptors 204 remain to be processed, the routine 600 proceeds from operation 638 to operation 640, where the next descriptor 204 in the descriptor list 202 is retrieved. The routine 600 then proceeds back to operation 608, where the descriptor 204 can be processed in the manner described above.

Figure 7:
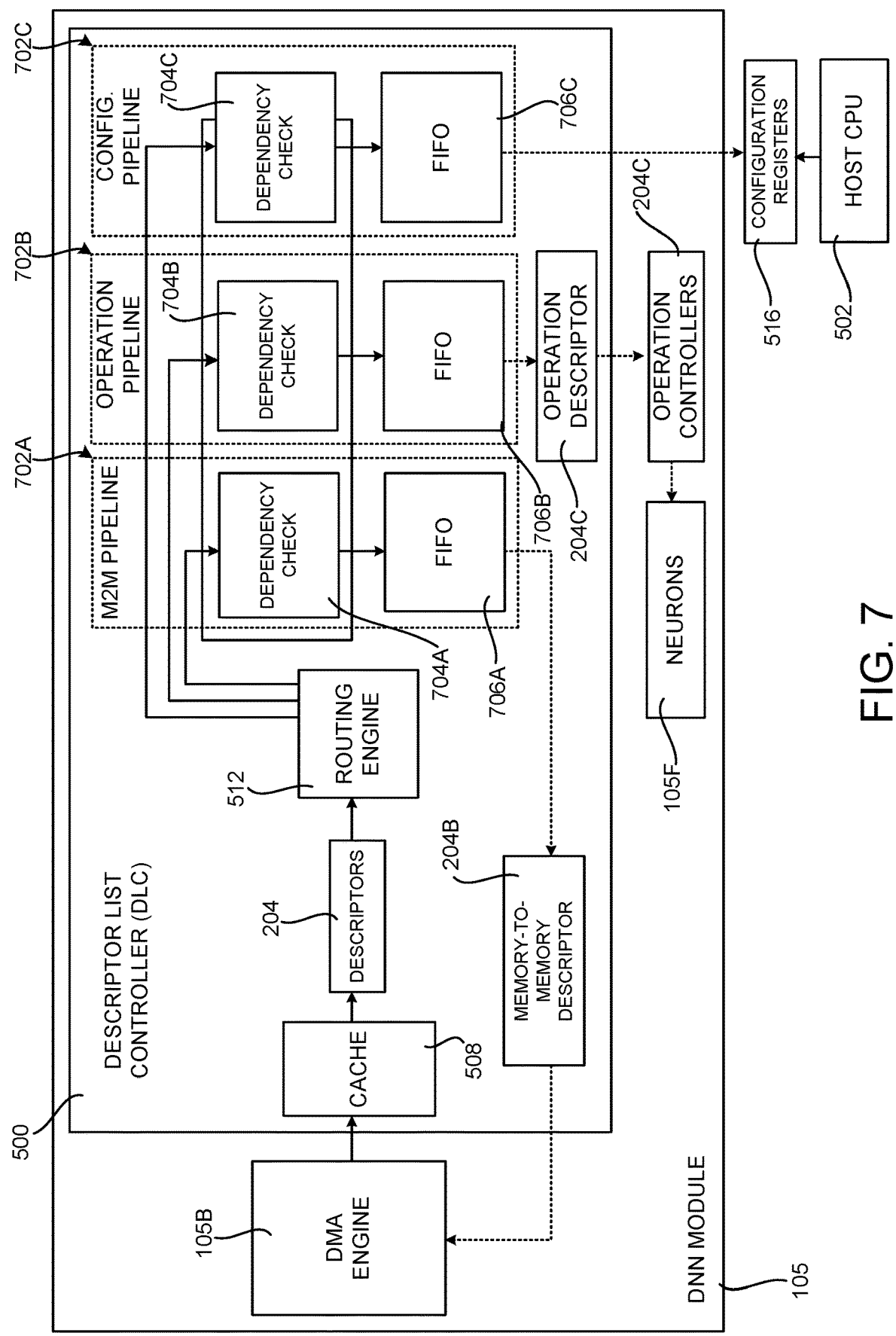
FIG. 7 is a computing architecture diagram that illustrates additional details of the configuration and operation of a DNN module configured for executing descriptors in a layer descriptor list and for providing layer and operation fencing and dependency management, according to one embodiment.

FIG. 7 is a computing architecture diagram that illustrates additional details of the configuration and operation of a DNN module 105 configured for executing descriptors 204 in a layer descriptor list 202 and for providing layer and operation fencing and dependency management, according to one embodiment. As shown in FIG. 7 and described briefly above, the routing engine 512 can route different types of descriptors to different pipelines 702.

In the example configuration shown in FIG. 7, the DLC 500 implements three pipelines: an M2M pipeline 702A; an operation pipeline 702B; and a configuration pipeline 702C, each of which will be described below. The pipelines 702 operate independent so, for example, the pipeline 702A can execute the next M2M descriptor 204B while the pipeline 702B is executing an operation descriptor 204C if no dependency has been specifically defined. As will be described below, if an unmet dependency is identified in a descriptor 204 in one of the pipelines 702, the other pipelines 702 can continue executing descriptors 204.

The routing engine 512 routes M2M descriptors 204B to the M2M pipeline 702A. As illustrated in FIG. 7, the M2M pipeline 702A includes a dependency check unit 704A and a first-in-first-out ("FIFO") memory 706A. The dependency check unit 704A determines whether M2M descriptors 204B specify a dependency (i.e. the field 402F identifies another descriptor 204 upon which execution of a M2M descriptor 204 is dependent) or indicate that a fence operation is to be performed prior to executing the M2M descriptor 204B (i.e. the field 402D indicates that a fence operation is to be performed such as by being set to a logical '1').

As discussed briefly above, dependency checking can be performed by determining whether the ID label 212 of the most recently completed layer descriptor 204 stored in the hardware register of the DNN module 105 is less than the ID label 212 of the layer descriptor 204 upon which it is dependent. The current descriptor 204 will be executed if the ID label 212 of the most recently completed layer descriptor 204 is not less than the ID label 212 of the descriptor upon which it is dependent.

Execution of the current descriptor 204 will be stalled if the ID label 212 of the most recently completed layer descriptor 204 is less than the ID label 212 of the descriptor upon which the current descriptor is dependent. Execution of the current descriptor 204 will be stalled until the ID label 212 of the most recently completed layer descriptor 204 is equal to the ID label 212 of the descriptor 204 upon which the current descriptor 204 is dependent.

It is to be appreciated that all combinations of dependencies must be checked. For example, it must be determined if a M2M descriptor is dependent upon another M2M descriptor, whether a M2M descriptor is dependent upon an operation descriptor 204C, whether an operation descriptor 204C is dependent upon another operation descriptor 204C, and whether an operation descriptor 204C is dependent upon a M2M descriptor 204B. Additionally, it is also to be appreciated that certain dependency situations still allow descriptors 204 to flow through a pipeline 702. For example, if a descriptor 204 is stalled due to a dependency on another descriptor 204 and there is an M2M descriptor 204B behind the stalled descriptor that has no dependencies, then that M2M descriptor 204B can move around the stalled descriptor 204 and execute.

It is to be further appreciated that the execution of a descriptor 204 can depend upon a read operation or a write operation. For example, if the current descriptor 204 in a pipeline 702 will write to a memory location that is currently being read from by another descriptor 204, then the current descriptor must wait until the read operation has completed. Similarly, if the current descriptor 204 will read from a location that is currently being written to by another descriptor 204, then the current descriptor 204 needs to wait until the write operation has completed.

A fence check operation can be performed by determining whether all layer descriptors 204 in the list of layer descriptors 202 having an ID label 212 less than the label ID 212 of the current layer descriptor 204A have completed execution. This can be accomplished by comparing the label ID 212 of the current descriptor 204 to the label ID 212 of the most recently completed layer descriptor 204. The current layer descriptor 204 will be executed if all layer descriptors 204 in the list of layer descriptors 202 having ID labels 212 less than the ID label 212 of the first layer descriptor 204A have completed execution. The current layer descriptor 204 will not be executed if all layer descriptors 204 in the list of layer descriptors 202 having ID labels 212 less than the ID label 212 of the first layer descriptor 204A have not completed execution.

Once any fences or dependencies in M2M descriptors 204B in the M2M pipeline 702A have been resolved, the current M2M descriptor 204B can be routed through the FIFO memory 706A to the DMA engine 105B for processing in the manner described above. In this way, the fence operation guarantees that there are no other descriptors 204 in a pipeline 702 before processing the descriptor 204 that has the fence be asserted.

The routing engine 512 also routes operation descriptors 204C to the operation pipeline 702B. The dependency check unit 704B can then evaluate any fences or dependencies specified by the current operational descriptor 204C in the manner described above. Once any fences or dependencies in operation descriptors 204C in the operation pipeline 702B have been resolved, the current operation descriptor 204C can be routed through the FIFO memory 706B to the DMA engine 105B for processing in the manner described above.

The routing engine 512 also routes configuration descriptors 204A to the configuration pipeline 702C. The dependency check unit 704C can then evaluate any fences or dependencies specified by the current configuration descriptor 204A in the manner described above. Once a fence or dependency specified by the current configuration descriptor 204A have been resolved, the current configuration descriptor 204A can be routed through the FIFO memory 706C to the configuration registers 516 as described above.

Figure 8:
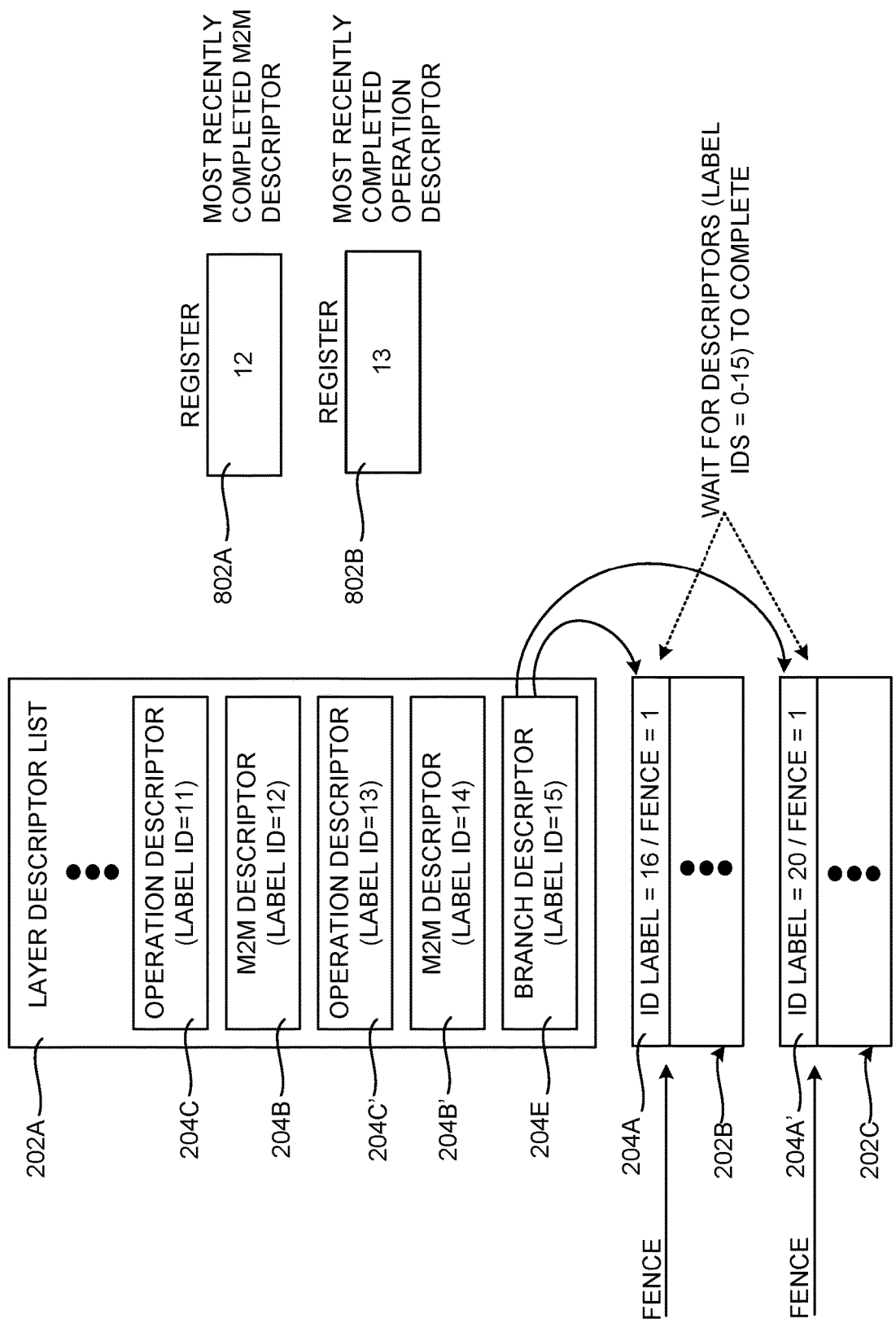
FIG. 8 is a data structure diagram that illustrates aspects of the operation of a DNN module for performing a fence operation, according to one embodiment.

FIG. 8 is a data structure diagram that illustrates aspects of the operation of the DNN module 105 for performing a fence operation, according to one embodiment. In the example shown in FIG. 8, a layer descriptor list 202A includes an operation descriptor 204C, a M2M descriptor 204B, an operation descriptor 204C', an M2M descriptor 204B', and a branch descriptor 204E. A hardware register 802A is utilized to store the ID label 212 of the most recently completed M2M descriptor 204B and a hardware register 802B is utilized to store the ID label 212 of the most recently completed operation descriptor 204C. As mentioned above, separate registers 802 can be maintained to store the ID label 212 of the most recently completed descriptor 204 of each descriptor type.

In the example shown in FIG. 8, the operation descriptor 204C is executed first and, when complete, causes the value in the register 802B to be set to 11 (i.e. the value of the ID label 212 of the operation descriptor 204C). The M2M descriptor 204B is then executed and, when complete, causes the value in the register 802A to be set to 12. The operation descriptor 204C and the M2M descriptor 204B can be executed in parallel because no dependencies have been set by these descriptors.

The operation descriptor 204C' is then executed and, when complete, the value of the register 802B is set to 13. Execution of the M2M descriptor 204B' is then started. Because the M2M descriptor 204B' does not specify any dependencies, execution of the branch descriptor 204E can be performed by the pipeline 204C in parallel. The branch descriptor 204E indicates that a branch is to be made to the head of the descriptor list 202B if a specified condition is met. If the specified condition is not met, a branch is to be made to the head of the layer descriptor list 202C.

The first descriptor 204 in the descriptor list 202B is a configuration descriptor 204A. The descriptor 204A indicates that a fence operation is to be performed. Similarly, the first descriptor 204 in the descriptor list 202C is a configuration descriptor 204A'. This descriptor 204A' also indicates that a fence operation is to be performed. Accordingly, a fence operation will be performed when execution of the descriptor list 202B and the descriptor list 202C begins.

As discussed above, the fence operation requires that all descriptors 204 in a descriptor list 202 having an ID label 212 lower than the current descriptor 204 have completed before the current descriptor 204 can be executed. In the example shown in FIG. 8, this means that descriptors 204 having ID labels 212 lower than 16 (i.e. the ID label 212 of the descriptor 204A) must have completed before execution of the descriptor 204A can begin. Through an examination of the registers 802A and 802B, the DLC 500 can determine that the most recently completed descriptor 204 is the operation descriptor 204C', which has an ID label 212 of 13. Accordingly, execution of the configuration descriptor 204A (or the configuration 204A') will be stalled until the M2M descriptor 204B' has completed and the value in the register 802A has been set to 14.

Figure 9A:
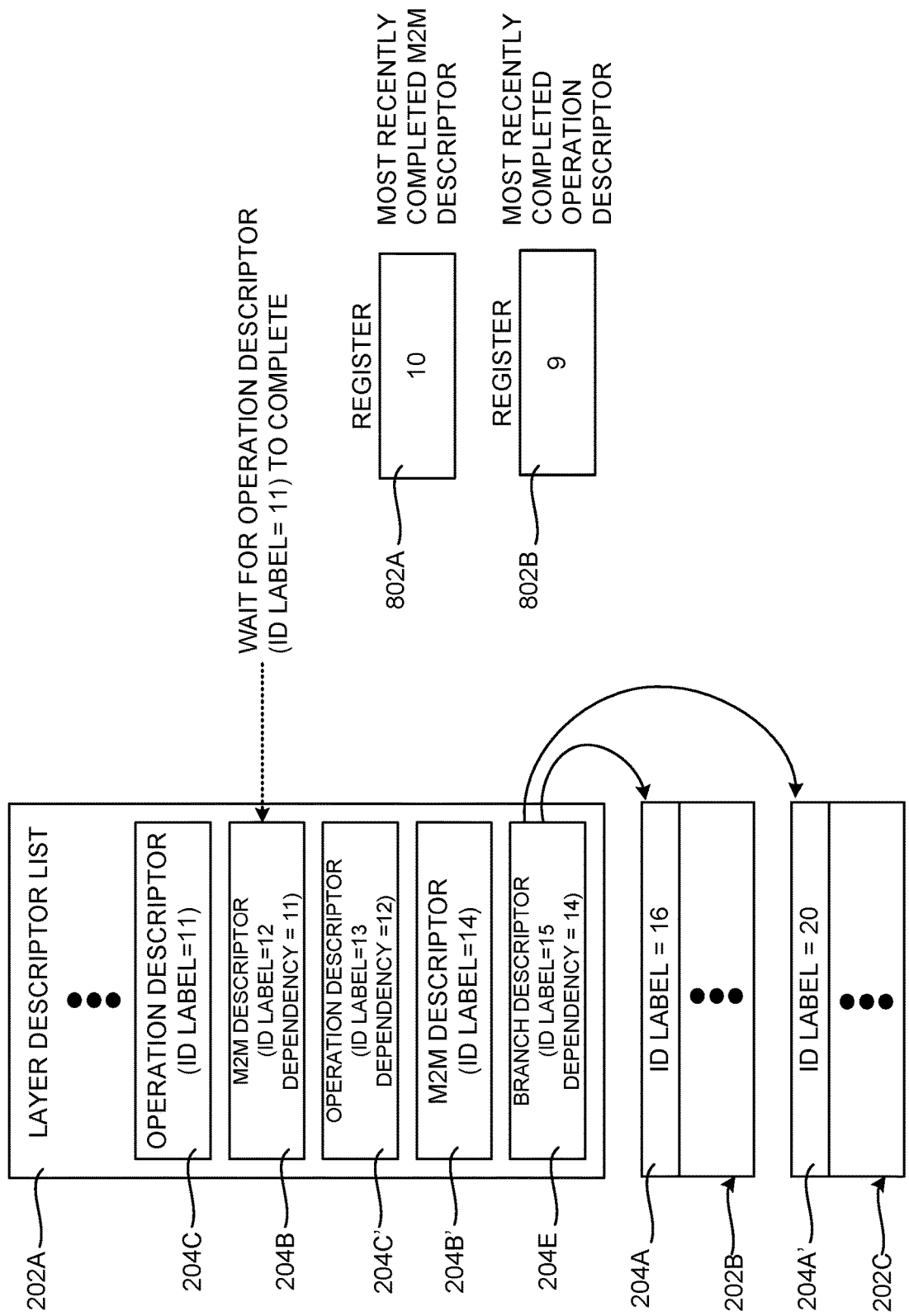
FIGS. 9A-9C are data structure diagrams that illustrate aspects of the operation of a DNN module for enforcing operation dependencies, according to one embodiment.
Figure 9B:
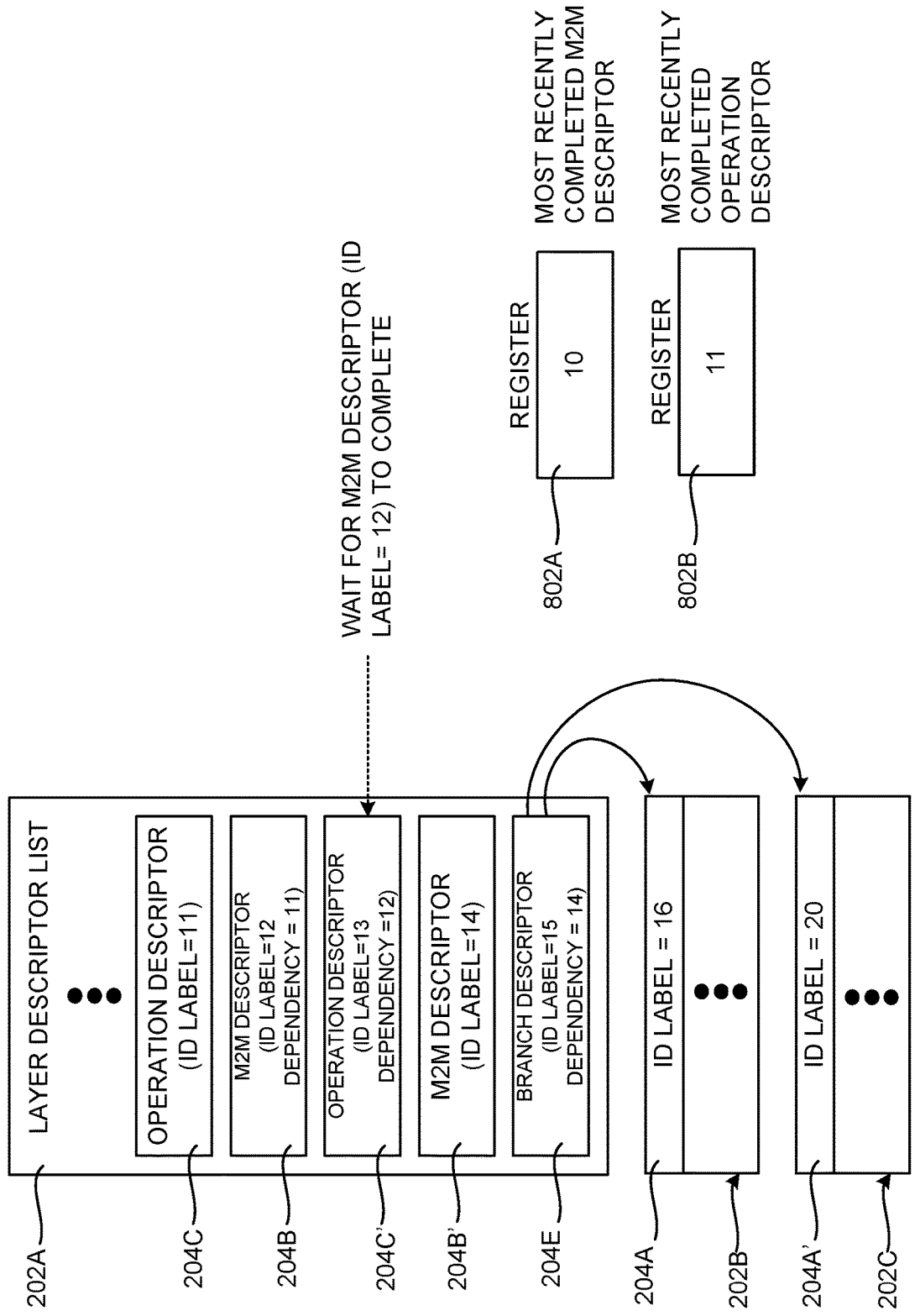
Figure 9C:
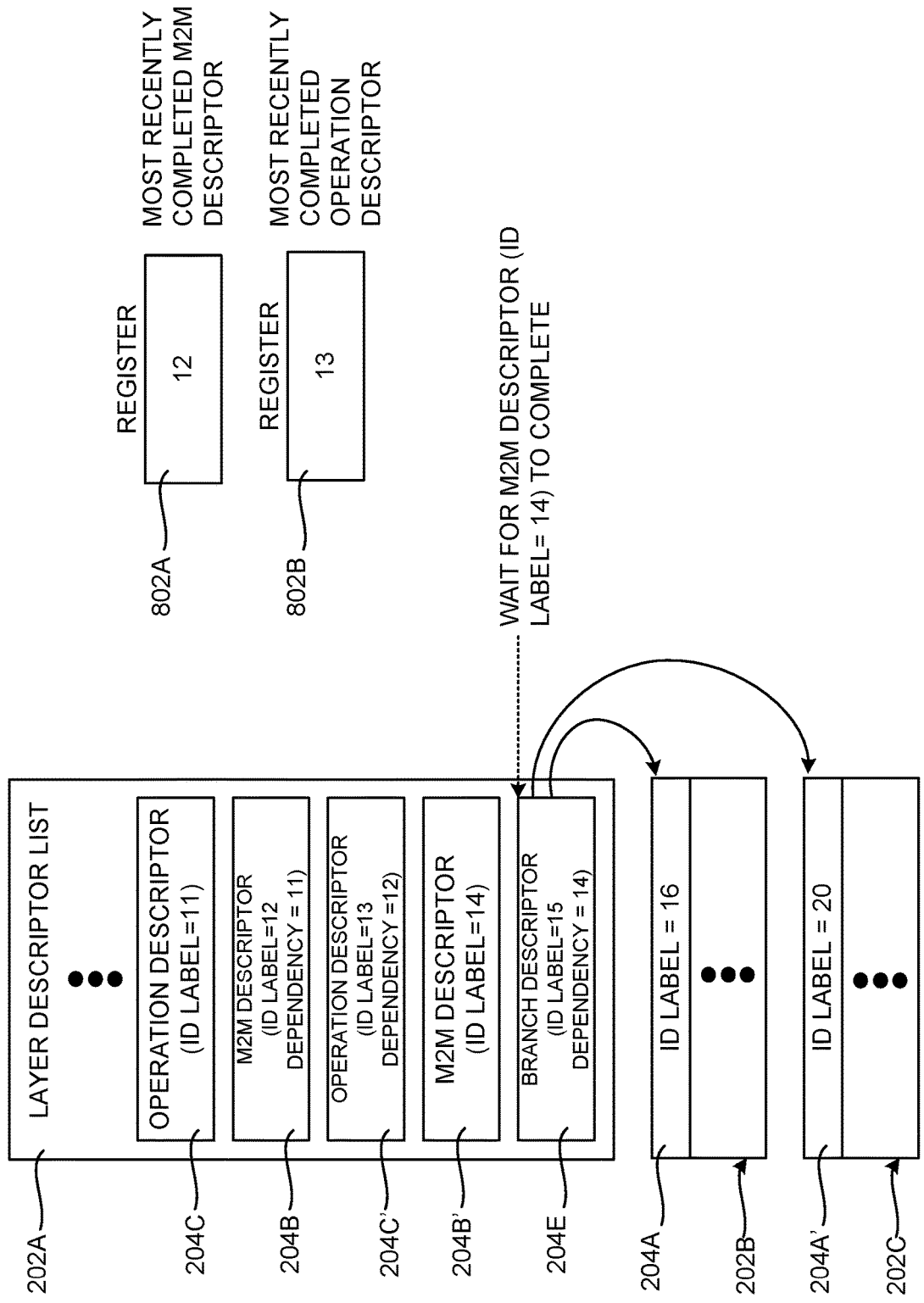

FIGS. 9A-9C are data structure diagrams that illustrate aspects of the operation of the DNN module 105 for enforcing dependencies, according to one embodiment. As in the example shown in FIG. 8, the illustrative layer descriptor list 202A shown in FIGS. 9A-9C includes an operation descriptor 204C, a M2M descriptor 204B, an operation descriptor 204C', an M2M descriptor 204B', and a branch descriptor 204E. A hardware register 802A is utilized to store the ID label 212 of the most recently completed M2M descriptor 204B and a hardware register 802B is utilized to store the ID label 212 of the most recently completed operation descriptor 204C.

In this example, the execution of operation descriptor 204C begins first. Because no dependency has been set by the operation descriptor 204C, the execution of the M2M descriptor 204B can begin. In this example, however, the M2M descriptor 204B specifies a dependency on the operation descriptor 204C. Accordingly, execution of the M2M descriptor 204B will be stalled until the operation descriptor 204C completes and the value of the register 802B is set to 11, as shown in FIG. 9B.

As shown in FIG. 9B, the operation descriptor 204C' has a dependency upon the M2M descriptor 204B. Execution of the operation descriptor 204C' will, therefore, be stalled until the M2M descriptor 204B has completed and the value of the register 802A has been set to 11. Once this occurs, the operation descriptor 204C' will be executed and, when complete, will cause the value in register 802B to be set to 13. The M2M descriptor 204B' will also begin execution.

As shown in FIG. 9C, the branch descriptor 204E also has a dependency set, in this case on the M2M descriptor 204B'. Accordingly, the branch descriptor 204E will be stalled until the M2M descriptor 204B' has completed and the value of the register 802A has been set to 14. Once that occurs, execution can branch to either descriptor 204A or 204A' depending upon the results of the evaluation of the specified condition. It is to be appreciated that the example shown in FIGS. 8 and 9A-9C are merely illustrative and have been simplified for discussion purposes.

Figure 10:
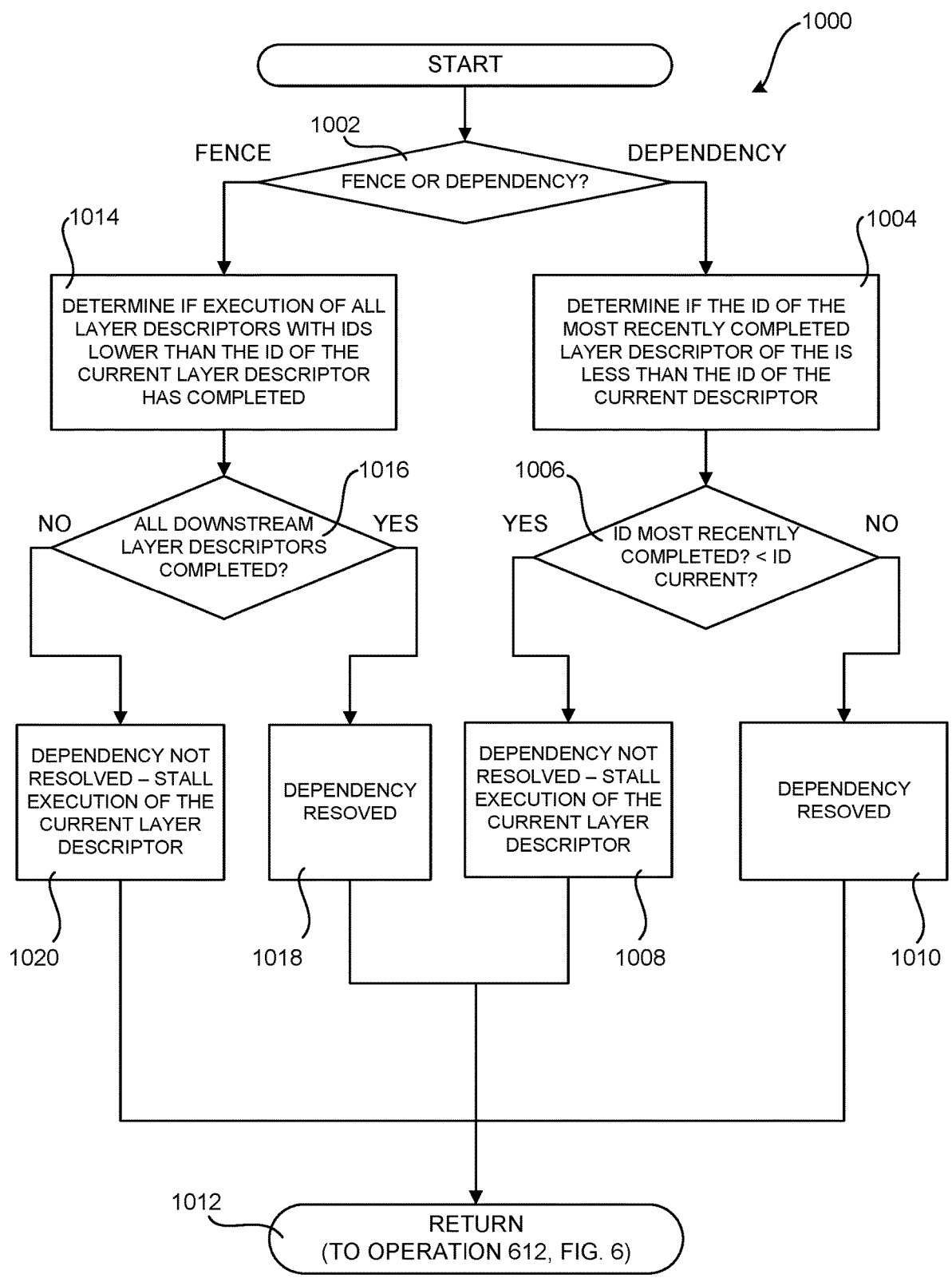
FIG. 10 is a flow diagram showing a routine that illustrates aspects of the operation of a DNN module for providing layer and operation fencing and dependency management, according to one embodiment disclosed herein.

FIG. 10 is a flow diagram showing a routine 1000 that illustrates aspects of the operation of the DNN module 105 for providing layer and operation fencing and dependency management, according to one embodiment disclosed herein. The routine 1000 begins at operation 1002, where the DLC 500 determines whether a dependency or a fence is to be enforced. If a dependency is to be enforced, the routine 1000 proceeds from operation 1002 to operation 1004.

At operation 1004, the DLC 500 determines if the ID label 212 of the most recently completed layer descriptor 204 is less than the label ID 212 of the descriptor 204 specifying the dependency. If the ID label 212 of the most recently completed layer descriptor 204 is less than the label ID 212 of the descriptor 204 specifying the dependency, this means that the dependency has not been resolved. Accordingly, the routine 1000 proceeds from operation 1006 to operation 1008, where execution of the descriptor 204 specifying the dependency is stalled. The routine 1000 then proceeds from operation 1008 to operation 1012. At operation 1012, processing proceeds to operation 612 of the routine 600 described above with regard to FIG. 6.

If the ID label 212 of the most recently completed layer descriptor 204 is not less than the label ID 212 of the descriptor 204 specifying the dependency, this means that the dependency has been resolved. Accordingly, the routine 1000 proceeds from operation 1006 to operation 1010, where execution of the descriptor 204 specifying the dependency is started. The routine 1000 then proceeds from operation 1010 to operation 1012. At operation 1012, processing proceeds to operation 612 of the routine 600 described above with regard to FIG. 6.

If, at operation 1002, the DLC 500 determines that a fence is to be enforced, the routine 1000 proceeds from operation 1002 to operation 1014. At operation 1014, the DLC 500 determines whether the execution of all layer descriptors 204 in the layer descriptor list 202 having ID labels 212 lower than the ID label 212 of the current layer descriptor 204 has completed. If execution of all descriptors 204 with lower ID labels 212 has not completed, the routine 1000 proceeds from operation 1016 to operation 1020, where execution of the current layer descriptor 204 is stalled. The routine 1000 then proceeds from operation 1020 to operation 1012. At operation 1012, processing proceeds to operation 612 of the routine 600 described above with regard to FIG. 6.

If execution of all descriptors 204 having ID labels 212 less than the current descriptor 204 has completed, the routine 1000 proceeds from operation 1016 to operation 1018, where execution of the current descriptor 204 can be started. The routine 1000 then proceeds from operation 1018 to operation 1012. At operation 1012, processing proceeds to operation 612 of the routine 600 described above with regard to FIG. 6.

Figure 11:
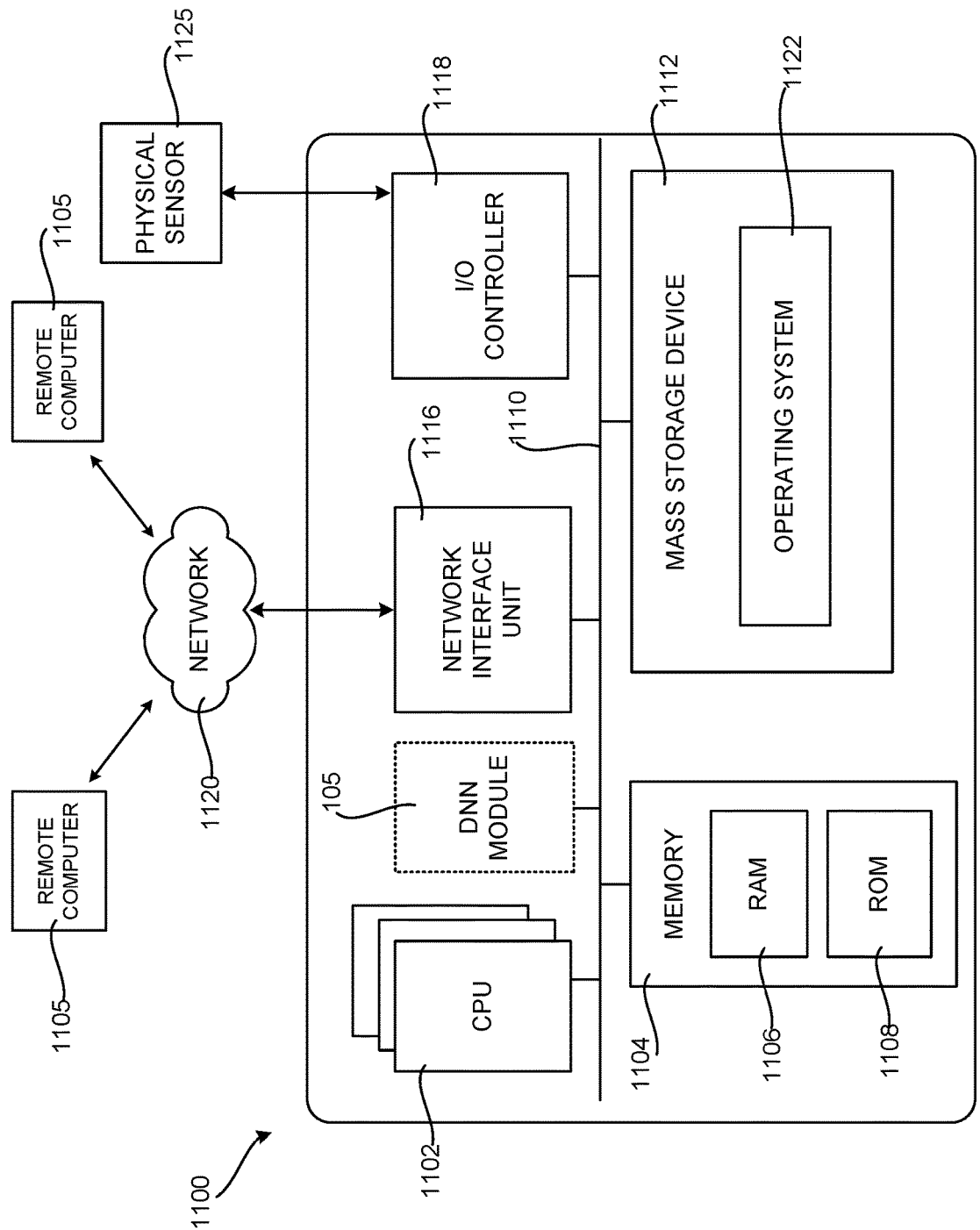
FIG. 11 is a computer architecture diagram showing an illustrative computer hardware and software architecture for a computing device that can act as an application host for the DNN module presented herein, according to one embodiment.

FIG. 11 is a computer architecture diagram showing an illustrative computer hardware and software architecture for a computing device that can act as an application host for the DNN module 105 presented herein. In particular, the architecture illustrated in FIG. 11 can be utilized to implement a server computer, mobile phone, an e-reader, a smartphone, a desktop computer, an AR/VR device, a tablet computer, a laptop computer, or another type of computing device suitable for use with the DNN module 105.

The computer 1100 illustrated in FIG. 11 includes a central processing unit 1102 ("CPU"), a system memory 1104, including a random-access memory 1106 ("RAM") and a read-only memory ("ROM") 1108, and a system bus 1110 that couples the memory 1104 to the CPU 1102. A basic input/output system ("BIOS" or "firmware") containing the basic routines that help to transfer information between elements within the computer 1100, such as during startup, can be stored in the ROM 1108. The computer 1100 further includes a mass storage device 1112 for storing an operating system 1122, application programs, and other types of programs. The mass storage device 1112 can also be configured to store other types of programs and data.

The mass storage device 1112 is connected to the CPU 1102 through a mass storage controller (not shown) connected to the bus 1110. The mass storage device 1112 and its associated computer readable media provide non-volatile storage for the computer 1100. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 1100.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 1100. For purposes of the claims, the phrase "computer storage medium," and variations thereof, does not include waves or signals per se or communication media.

According to various configurations, the computer 1100 can operate in a networked environment using logical connections to remote computers through a network such as the network 1120. The computer 1100 can connect to the network 1120 through a network interface unit 1116 connected to the bus 1110. It should be appreciated that the network interface unit 1116 can also be utilized to connect to other types of networks and remote computer systems. The computer 1100 can also include an input/output controller 1118 for receiving and processing input from a number of other devices, including a keyboard, mouse, touch input, an electronic stylus (not shown in FIG. 11), or a physical sensor such as a video camera. Similarly, the input/output controller 1118 can provide output to a display screen or other type of output device (also not shown in FIG. 11).

It should be appreciated that the software components described herein, when loaded into the CPU 1102 and executed, can transform the CPU 1102 and the overall computer 1100 from a general-purpose computing device into a special-purpose computing device customized to facilitate the functionality presented herein. The CPU 1102 can be constructed from any number of transistors or other discrete circuit elements, which can individually or collectively assume any number of states. More specifically, the CPU 1102 can operate as a finite-state machine, in response to executable instructions contained within the software modules disclosed herein. These computer-executable instructions can transform the CPU 1102 by specifying how the CPU 1102 transitions between states, thereby transforming the transistors or other discrete hardware elements constituting the CPU 1102.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 1100 in order to store and execute the software components presented herein. It also should be appreciated that the architecture shown in FIG. 11 for the computer 1100, or a similar architecture, can be utilized to implement other types of computing devices, including hand-held computers, video game devices, embedded computer systems, mobile devices such as smartphones, tablets, and AR/VR devices, and other types of computing devices known to those skilled in the art. It is also contemplated that the computer 1100 might not include all of the components shown in FIG. 11, can include other components that are not explicitly shown in FIG. 11, or can utilize an architecture completely different than that shown in FIG. 11.

Figure 12:
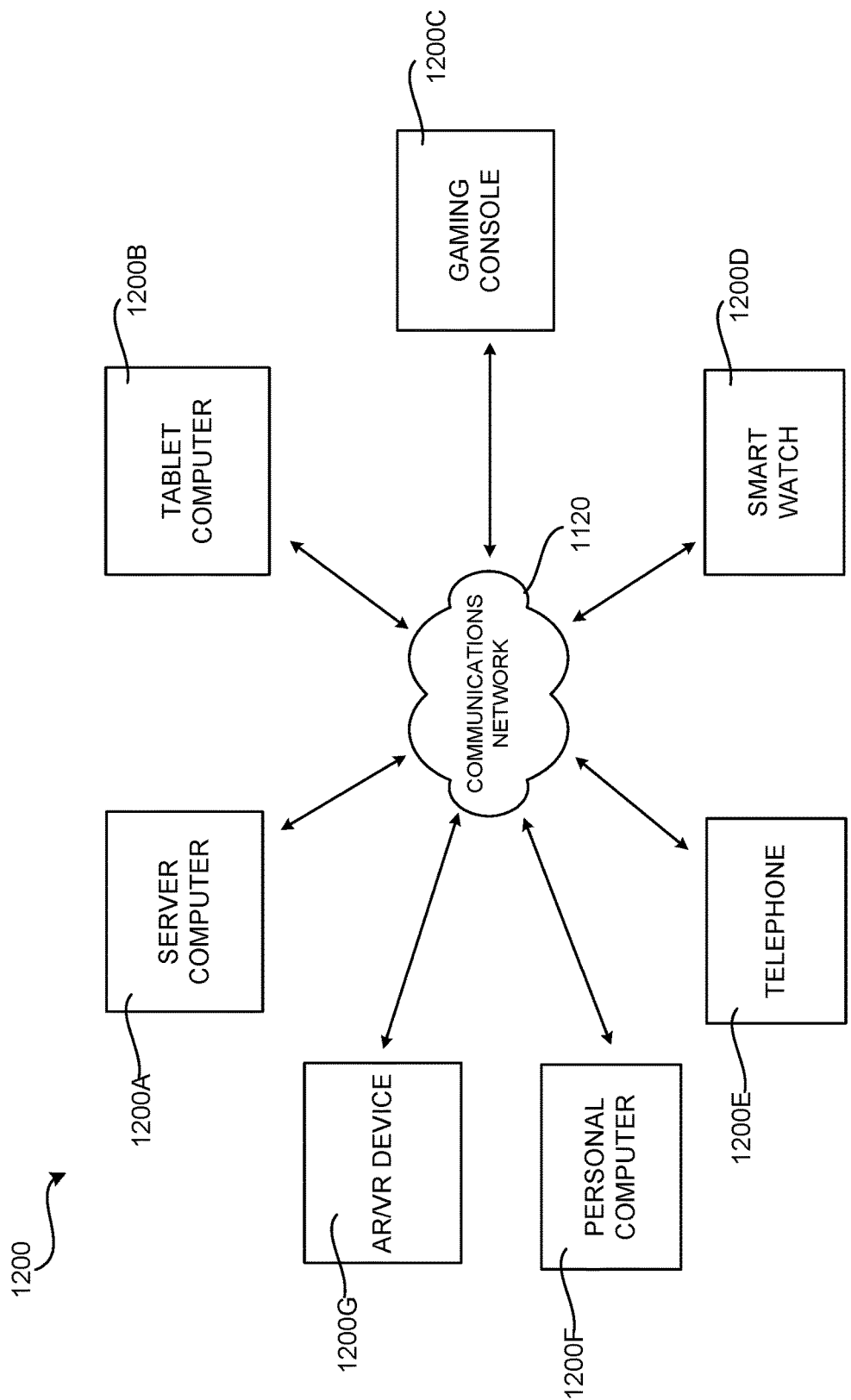
FIG. 12 is a network diagram illustrating a distributed computing environment in which aspects of the disclosed technologies can be implemented, according to various embodiments presented herein.

FIG. 12 is a network diagram illustrating a distributed network computing environment 1200 in which aspects of the disclosed technologies can be implemented, according to various embodiments presented herein. As shown in FIG. 12, one or more server computers 1200A can be interconnected via a communications network 1120 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 1200B, a gaming console 1200C, a smart watch 1200D, a telephone 1200E, such as a smartphone, a personal computer 1200F, and an AR/VR device 1200G.

In a network environment in which the communications network 1120 is the Internet, for example, the server computer 1200A can be a dedicated server computer operable to process and communicate data to and from the client computing devices 1200B-1200G via any of a number of known protocols, such as, hypertext transfer protocol ("HTTP"), file transfer protocol ("FTP"), or simple object access protocol ("SOAP"). Additionally, the networked computing environment 1200 can utilize various data security protocols such as secured socket layer ("SSL") or pretty good privacy ("PGP"). Each of the client computing devices 1200B-1200G can be equipped with an operating system operable to support one or more computing applications or terminal sessions such as a web browser (not shown in FIG. 12), or other graphical user interface (not shown in FIG. 12), or a mobile desktop environment (not shown in FIG. 12) to gain access to the server computer 1200A.

The server computer 1200A can be communicatively coupled to other computing environments (not shown in FIG. 12) and receive data regarding a participating user's interactions/resource network. In an illustrative operation, a user (not shown in FIG. 12) may interact with a computing application running on a client computing device 1200B-1200G to obtain desired data and/or perform other computing applications.

The data and/or computing applications may be stored on the server 1200A, or servers 1200A, and communicated to cooperating users through the client computing devices 1200B-1200G over an exemplary communications network 1120. A participating user (not shown in FIG. 12) may request access to specific data and applications housed in whole or in part on the server computer 11800A. These data may be communicated between the client computing devices 1200B-1200G and the server computer 1200A for processing and storage.

The server computer 1200A can host computing applications, processes and applets for the generation, authentication, encryption, and communication of data and applications, and may cooperate with other server computing environments (not shown in FIG. 12), third party service providers (not shown in FIG. 12), network attached storage ("NAS") and storage area networks ("SAN") to realize application/data transactions.

It should be appreciated that the computing architecture shown in FIG. 11 and the distributed network computing environment shown in FIG. 12 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1. A neural network processor, comprising: a memory device storing a list of layer descriptors comprising a first layer descriptor for a neural network, the first layer descriptor specifying an identifier (ID) for a second layer descriptor upon which its execution is dependent; a hardware register storing an ID of a most recently completed layer descriptor; and a controller configured to determine whether the ID of the most recently completed layer descriptor stored in the hardware register is less than an ID of the second layer descriptor, cause the neural network processor to execute the first layer descriptor responsive to determining that the ID of the most recently completed layer descriptor is not less than the ID of the second layer descriptor, and cause the neural network processor to stall execution of the first layer descriptor responsive to determining that the ID for the most recently completed layer descriptor is less than the ID of the second layer descriptor.

Clause 2. The neural network processor of clause 1, wherein execution of the first layer descriptor is stalled until the ID of the most recently completed layer descriptor stored in the hardware register is equal to the ID of the second layer descriptor.

Clause 3. The neural network processor of any of clauses 1-2, wherein the neural network processor is further configured to execute layer descriptors in the list of layer descriptors and to store the ID of the most recently completed layer descriptor in the hardware register.

Clause 4. The neural network processor of any of clauses 1-3, identifiers are assigned to the layer descriptors in the list of layer descriptors in a monotonically increasing order.

Clause 5. The neural network processor of any of clauses 1-4, wherein the first layer descriptor comprises one of a memory-to-memory move (M2M) descriptor, an operation descriptor, a host communication descriptor, a configuration descriptor, a branch descriptor, or a synchronization descriptor.

Clause 6. The neural network processor of any of clauses 1-5, wherein the second layer descriptor comprises one of a memory-to-memory move (M2M) descriptor, an operation descriptor, a host communication descriptor, a configuration descriptor, a branch descriptor, or a synchronization descriptor.

Clause 7. The neural network processor of any of clauses 1-6, wherein the list of layer descriptors comprises a third layer descriptor specifying a fence operation, and wherein the controller is further configured to: determine, based at least in part upon the ID of the most recently completed layer descriptor, whether all layer descriptors in the list of layer descriptors having an ID less than an ID of the third layer descriptor have completed execution, cause the neural network processor to execute the third layer descriptor responsive to determining that all layer descriptors in the list of layer descriptors having an ID less than the ID of the third layer descriptor have completed execution, and cause the neural network processor to stall execution of the third layer descriptor responsive to determining that all layer descriptors in the list of layer descriptors having an ID less than the ID of the third layer descriptor have not completed execution.

Clause 8. A neural network processor, comprising: a memory device storing a list of layer descriptors comprising a first layer descriptor for a neural network; a hardware register storing an identifier (ID) of a most recently completed layer descriptor; and a controller configured to determine, based at least in part upon the ID of the most recently completed layer descriptor, whether all layer descriptors in the list of layer descriptors having an ID less than the ID of the first layer descriptor have completed execution, cause the neural network processor to execute the first layer descriptor responsive to determining that all layer descriptors in the list of layer descriptors having an ID less than the ID of the first layer descriptor have completed execution, and cause the neural network processor to stall execution of the first layer descriptor responsive to determining that all layer descriptors in the list of layer descriptors having an ID less than the ID of the first layer descriptor have not completed execution.

Clause 9. The neural network processor of clause 8, wherein execution of the first layer descriptor is stalled until all layer descriptors in the list of descriptors having an ID less than the ID of the first layer descriptor have completed execution.

Clause 10. The neural network processor of any of clauses 8-9, wherein the neural network processor is further configured to execute layer descriptors in the list of layer descriptors and to store the ID of the most recently completed layer descriptor in the hardware register.

Clause 11. The neural network processor of any of clauses 8-10, wherein identifiers are assigned to the layer descriptors in the list of layer descriptors in a monotonically increasing order.

Clause 12. The neural network processor of any of clauses 8-11, wherein the first layer descriptor comprises one of a memory-to-memory move (M2M) descriptor, an operation descriptor, a host communication descriptor, a configuration descriptor, a branch descriptor, or a synchronization descriptor.

Clause 13. The neural network processor of any of clauses 8-12, wherein the descriptors in the list of layer descriptors comprise one or more of a memory-to-memory move (M2M) descriptor, an operation descriptor, a host communication descriptor, a configuration descriptor, a branch descriptor, or a synchronization descriptor.

Clause 14. The neural network processor of any of clauses 8-13, wherein the list of layer descriptors further comprises a second layer descriptor, the second layer descriptor specifying an identifier ID for a third layer descriptor upon which its execution is dependent, and wherein the controller is further configured to: determine whether the ID of the most recently completed layer descriptor stored in the hardware register is less than an ID of the third layer descriptor, cause the neural network processor to execute the second layer descriptor responsive to determining that the ID of the most recently completed layer descriptor is not less than the ID of the third layer descriptor, and cause the neural network processor to stall execution of the second layer descriptor responsive to determining that the ID for the most recently completed layer descriptor is less than the ID of the third layer descriptor.

Clause 15. A computer-implemented method, comprising: accessing, by way of a neural network module, a list of layer descriptors comprising a first layer descriptor for a neural network, the first layer descriptor specifying an identifier (ID) for a second layer descriptor upon which its execution is dependent; determining whether an identifier (ID) of a most recently completed layer descriptor is less than an ID of the second layer descriptor; executing, by way of the neural network module, the first layer descriptor responsive to determining that the ID of the most recently completed layer descriptor is not less than the ID of the second layer descriptor; and stalling, by way of the neural network module, execution of the first layer descriptor responsive to determining that the ID for the most recently completed layer descriptor is less than the ID of the second layer descriptor.

Clause 16. The computer-implemented method of clause 15, wherein execution of the first layer descriptor is stalled until the ID of the most recently completed layer descriptor is equal to the ID of the second layer descriptor.

Clause 17. The computer-implemented method of any of clauses 15-16, further comprising: executing layer descriptors in the list of layer descriptors; and storing the ID of the most recently completed layer descriptor in a hardware register of the neural network module.

Clause 18. The computer-implemented method of any of clauses 15-17, wherein identifiers are assigned to the layer descriptors in the list of layer descriptors in a monotonically increasing order.

Clause 19. The computer-implemented method of any of clauses 15-18, wherein the first layer descriptor and the second layer descriptor comprise one of a memory-to-memory move (M2M) descriptor, an operation descriptor, a host communication descriptor, a configuration descriptor, a branch descriptor, or a synchronization descriptor.

Clause 20. The computer-implemented method of any of clauses 15-19, wherein the list of layer descriptors comprises a third layer descriptor specifying a fence operation, and wherein the computer-implemented method further comprises: determining, based at least in part upon the ID of the most recently completed layer descriptor, whether all layer descriptors in the list of layer descriptors having an ID less than an ID of the third layer descriptor have completed execution; executing the third layer descriptor by way of the neural network module responsive to determining that all layer descriptors in the list of layer descriptors having an ID less than the ID of the third layer descriptor have completed execution, and stalling execution of the third layer descriptor by way of the neural network processor responsive to determining that all layer descriptors in the list of layer descriptors having an ID less than the ID of the third layer descriptor have not completed execution.

Based on the foregoing, it should be appreciated that a neural network module configured for layer and operation fencing and dependency management has been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A neural network processor, comprising:
   a memory device storing a list of layer descriptors comprising a first layer descriptor for a neural network, the first layer descriptor specifying an identifier (ID) for a second layer descriptor upon which its execution is dependent, wherein the list of layer descriptors is pre-compiled and includes instructions for performing a forward pass of the neural network;
   a hardware register storing an ID of a most recently completed layer descriptor; and
   a controller configured to
      determine whether the ID of the most recently completed layer descriptor stored in the hardware register is less than an ID of the second layer descriptor,
      cause the neural network processor to execute the first layer descriptor responsive to determining that the ID of the most recently completed layer descriptor is not less than the ID of the second layer descriptor, and
      cause the neural network processor to stall execution of the first layer descriptor responsive to determining that the ID for the most recently completed layer descriptor is less than the ID of the second layer descriptor.

2. The neural network processor of claim 1, wherein execution of the first layer descriptor is stalled until the ID of the most recently completed layer descriptor stored in the hardware register is equal to the ID of the second layer descriptor.

3. The neural network processor of claim 1, wherein the neural network processor is further configured to execute layer descriptors in the list of layer descriptors and to store the ID of the most recently completed layer descriptor in the hardware register.

4. The neural network processor of claim 1, wherein the identifiers are assigned to the layer descriptors in the list of layer descriptors in a monotonically increasing order.

5. The neural network processor of claim 1, wherein the first layer descriptor comprises one of a memory-to-memory move (M2M) descriptor, an operation descriptor, a host communication descriptor, a configuration descriptor, a branch descriptor, or a synchronization descriptor.

6. The neural network processor of claim 1, wherein the second layer descriptor comprises one of a memory-to-memory move (M2M) descriptor, an operation descriptor, a host communication descriptor, a configuration descriptor, a branch descriptor, or a synchronization descriptor.

7. The neural network processor of claim 1, wherein the list of layer descriptors comprises a third layer descriptor specifying a fence operation, and wherein the controller is further configured to:
   determine, based at least in part upon the ID of the most recently completed layer descriptor, whether all layer descriptors in the list of layer descriptors having an ID less than an ID of the third layer descriptor have completed execution,
   cause the neural network processor to execute the third layer descriptor responsive to determining that all layer descriptors in the list of layer descriptors having an ID less than the ID of the third layer descriptor have completed execution, and
   cause the neural network processor to stall execution of the third layer descriptor responsive to determining that all layer descriptors in the list of layer descriptors having an ID less than the ID of the third layer descriptor have not completed execution.

8. A neural network processor, comprising:
   a memory device storing a list of layer descriptors comprising a first layer descriptor for a neural network;
   a hardware register storing an identifier (ID) of a most recently completed layer descriptor; and
   a controller configured to
      determine, based at least in part upon the ID of the most recently completed layer descriptor, whether all layer descriptors in the list of layer descriptors having an ID less than the ID of the first layer descriptor have completed execution,
      cause the neural network processor to execute the first layer descriptor responsive to determining that all layer descriptors in the list of layer descriptors having an ID less than the ID of the first layer descriptor have completed execution, and
      cause the neural network processor to stall execution of the first layer descriptor responsive to determining that all layer descriptors in the list of layer descriptors having an ID less than the ID of the first layer descriptor have not completed execution.

9. The neural network processor of claim 8, wherein execution of the first layer descriptor is stalled until all layer descriptors in the list of descriptors having an ID less than the ID of the first layer descriptor have completed execution.

10. The neural network processor of claim 8, wherein the neural network processor is further configured to execute layer descriptors in the list of layer descriptors and to store the ID of the most recently completed layer descriptor in the hardware register.

11. The neural network processor of claim 8, wherein identifiers are assigned to the layer descriptors in the list of layer descriptors in a monotonically increasing order.

12. The neural network processor of claim 8, wherein the first layer descriptor comprises one of a memory-to-memory move (M2M) descriptor, an operation descriptor, a host communication descriptor, a configuration descriptor, a branch descriptor, or a synchronization descriptor.

13. The neural network processor of claim 8, wherein the descriptors in the list of layer descriptors comprise one or more of a memory-to-memory move (M2M) descriptor, an operation descriptor, a host communication descriptor, a configuration descriptor, a branch descriptor, or a synchronization descriptor.

14. The neural network processor of claim 8, wherein the list of layer descriptors further comprises a second layer descriptor, the second layer descriptor specifying an identifier ID for a third layer descriptor upon which its execution is dependent, and wherein the controller is further configured to:
   determine whether the ID of the most recently completed layer descriptor stored in the hardware register is less than an ID of the third layer descriptor,
   cause the neural network processor to execute the second layer descriptor responsive to determining that the ID of the most recently completed layer descriptor is not less than the ID of the third layer descriptor, and
   cause the neural network processor to stall execution of the second layer descriptor responsive to determining that the ID for the most recently completed layer descriptor is less than the ID of the third layer descriptor.

15. A computer-implemented method, comprising:
   accessing, by way of a neural network module, a list of layer descriptors comprising a first layer descriptor for a neural network, the first layer descriptor specifying an identifier (ID) for a second layer descriptor upon which its execution is dependent;
   determining whether an identifier (ID) of a most recently completed layer descriptor is less than an ID of the second layer descriptor;
   executing, by way of the neural network module, the first layer descriptor responsive to determining that the ID of the most recently completed layer descriptor is not less than the ID of the second layer descriptor; and
   stalling, by way of the neural network module, execution of the first layer descriptor responsive to determining that the ID for the most recently completed layer descriptor is less than the ID of the second layer descriptor.

16. The computer-implemented method of claim 15, wherein execution of the first layer descriptor is stalled until the ID of the most recently completed layer descriptor is equal to the ID of the second layer descriptor.

17. The computer-implemented method of claim 15, further comprising:
   executing layer descriptors in the list of layer descriptors; and
   storing the ID of the most recently completed layer descriptor in a hardware register of the neural network module.

18. The computer-implemented method of claim 15, wherein identifiers are assigned to the layer descriptors in the list of layer descriptors in a monotonically increasing order.

19. The computer-implemented method of claim 15, wherein the first layer descriptor and the second layer descriptor comprise one of a memory-to-memory move (M2M) descriptor, an operation descriptor, a host communication descriptor, a configuration descriptor, a branch descriptor, or a synchronization descriptor.

20. The computer-implemented method of claim 15, wherein the list of layer descriptors comprises a third layer descriptor specifying a fence operation, and wherein the computer-implemented method further comprises:
   determining, based at least in part upon the ID of the most recently completed layer descriptor, whether all layer descriptors in the list of layer descriptors having an ID less than an ID of the third layer descriptor have completed execution;
   executing the third layer descriptor by way of the neural network module responsive to determining that all layer descriptors in the list of layer descriptors having an ID less than the ID of the third layer descriptor have completed execution, and stalling execution of the third layer descriptor by way of the neural network module responsive to determining that all layer descriptors in the list of layer descriptors having an ID less than the ID of the third layer descriptor have not completed execution.

\* \* \* \* \*